(12) United States Patent
Cheng et al.

(10) Patent No.: US 9,917,252 B2
(45) Date of Patent: Mar. 13, 2018

(54) GASBGE PHASE CHANGE MEMORY MATERIALS

(71) Applicant: MACRONIX INTERNATIONAL CO., LTD., Hsinchu (TW)

(72) Inventors: Huai-Yu Cheng, White Plains, NY (US); Hsiang-Lan Lung, Ardsley, NY (US)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 0 days.

(21) Appl. No.: 14/936,318

(22) Filed: Nov. 9, 2015

(65) Prior Publication Data

US 2016/0372661 A1 Dec. 22, 2016

Related U.S. Application Data

(60) Provisional application No. 62/181,957, filed on Jun. 19, 2015.

(51) Int. Cl.
*H01L 45/00* (2006.01)
*C22C 12/00* (2006.01)
(Continued)

(52) U.S. Cl.
CPC ............ *H01L 45/148* (2013.01); *C22C 12/00* (2013.01); *C22C 28/00* (2013.01); *C22C 30/00* (2013.01);
(Continued)

(58) Field of Classification Search
CPC ... G11C 11/56; H01L 27/409; H01L 27/2481; H01L 27/24; H01L 45/00; H01L 45/06;
(Continued)

(56) References Cited

U.S. PATENT DOCUMENTS 6,800,504 B2  10/2004  Li et al.
7,893,419 B2   2/2011  Hudgens et al.
(Continued)

OTHER PUBLICATIONS

Chen, et al., "Endurance Improvement of Ge2Sb2Te5-Based Phase Change Memory," IEEE Int'l Memory Workshop, 2009, May 10-14, 2009, 2 pages.
(Continued)

*Primary Examiner* — Fernando L Toledo
*Assistant Examiner* — Lawrence-Linh T Nguyen
(74) *Attorney, Agent, or Firm* — Haynes Beffel & Wolfeld LLP

(57) ABSTRACT

A Ga—Sb—Ge family of phase change memory materials is described, including $Ga_xSb_yGe_z$, wherein a Ga atomic concentration x is within a range from 20% to 45%, a Sb atomic concentration y is within a range from 25% to 40% and a Ge atomic concentration z is within a range from 25% to 55%, is described wherein the material has a crystallization transition temperature $T_x$ greater than 360° C. Adding impurities including one or more element selected from silicon Si, carbon C, oxygen O and nitrogen N, can also increase the crystallization transition temperature $T_x$ to temperatures greater than 400° C., and also reduce reset current.

20 Claims, 20 Drawing Sheets

(51) Int. Cl.
 C22C 28/00 (2006.01)
 C22C 30/00 (2006.01)
 H01B 1/02 (2006.01)
 H01L 27/24 (2006.01)
(52) U.S. Cl.
 CPC ........... *H01B 1/02* (2013.01); *H01L 27/2463* (2013.01); *H01L 45/06* (2013.01); *H01L 45/1233* (2013.01); *H01L 45/16* (2013.01); *H01L 45/1625* (2013.01)
(58) Field of Classification Search
 CPC ... H01L 45/124; H01L 45/126; H01L 45/144; H01L 45/148; H01L 45/1691
 See application file for complete search history.

(56) References Cited

U.S. PATENT DOCUMENTS

| | | | |
|---|---|---|---|
| 8,138,028 B2 | 3/2012 | Lung et al. | |
| 8,946,666 B2 | 2/2015 | Cheng et al. | |
| 9,337,421 B2 | 5/2016 | Chin et al. | |
| 2007/0171705 A1 | 7/2007 | Parkinson | |
| 2008/0253166 A1 | 10/2008 | Raberg et al. | |
| 2008/0272807 A1 | 11/2008 | Lowrey | |
| 2009/0014705 A1* | 1/2009 | Hsu | H01L 45/06 257/3 |
| 2009/0194759 A1 | 8/2009 | Chin et al. | |
| 2009/0230375 A1 | 9/2009 | Liang et al. | |
| 2010/0051895 A1 | 3/2010 | Hampton | |
| 2010/0054029 A1 | 3/2010 | Happ et al. | |
| 2011/0084240 A1 | 4/2011 | Schell et al. | |
| 2011/0207284 A1 | 8/2011 | Tominaga et al. | |
| 2012/0181499 A1* | 7/2012 | Chuang | H01L 45/06 257/2 |
| 2013/0277638 A1 | 10/2013 | Moradpour et al. | |
| 2015/0048291 A1 | 2/2015 | Cheng et al. | |

OTHER PUBLICATIONS

Cheng et al., "A thermally robust phase change memory by engineering the Ge/N concentration in (Ge, N)xSbTe z phase change materiaL" 2012 Int'l IEEE IEDM, Dec. 10-13, 2012, 4 pages.

Cheng et al., "The Crystallization Behavior of Ga—Sb Materials as a Function of Composition for Phase Change Random Access Memory," Phase Change and Ovonics Symposium, Sep. 2011, 7 pages.

Cheng et al., Ga46Sb54 Material for Fast Switching and Pb-Free Soldering Reflow Process Complying Phase-Change Memory, ECS J. Solid State Sci. Technol. 2014 vol. 3, issue 7, Jun. 2014, p. 263-p. 267.

Cheng, et al., "A high performance phase change memory with fast switching speed and high temperature retention by engineering the GexSbyTez phase change material," 2011 IEEE Int'l IEDM, Dec. 5-7, 2011, 4 pages.

Cheng, H.Y., et al., "Atomic-level engineering of phase change material for novel fast-switching and high-endurance PCM for storage class memory application," IEEE Int'l Electron Devices Meeting (IEDM), Dec. 9-11, 2013, 1.30.6.1,30.6.4.

Ciocchini, N., et al. "Unified reliability modeling of Ge-rich phase change memory for embedded applications" IEEE Int'l Electron Devices Meeting (IEDM), Dec. 9-11, 2013, pp. 22.1.1,22.1.4.

Kim, I.S., et al., "High performance PRAM cell scalable to sub-20nm technology with below 4F2 cell size, extendable to DRAM applications," 2010 Symp. on VLSI Technology, Jun. 15-17, 2010, 2 pages.

Lu et al., Ga14Sb86 film for ultralong data retention phase-change memory, J. Appl. Phys. 109, 064503, Jun. 2011, 4 pages.

Navarro, G., et al., "Trade-off between SET and data retention performance thanks to innovative materials for phase-change memory," IEEE Int'l Electron Devices Meeting (IEDM), Dec. 9-11, 2013, pp. 21.5.1,21.5.4.

Putero et al., Unusual crystallization behavior in Ga—Sb phase change alloys, APL Mat. 1, 062101, Dec. 2013, 7 pages.

Shah et al., "GaSb—Ge pseudobinary phase diagram," Journal of Electronic Materials, vol. 11, Issue 1, Jan. 1982, 53-58.

Wimmer, et al., Role of activation energy in resistance drift of amorphous phase change materials, Frontiers in Physics, Dec. 2014, vol. 2, Article 75, pp. 1-12.

Zuliani, P., et al., "Overcoming Temperature Limitations in Phase Change Memories With Optimized GexSbyTez," IEEE Trans. on Electron Devices, 60(12), Dec. 2013, pp. 4020,4026.

Office Action from U.S. Appl. No. 15/074,202 dated Nov. 3, 2016, 15 pages.

* cited by examiner

GASBGE PHASE CHANGE MEMORY MATERIALS

RELATED APPLICATIONS

This application claims the benefit of U.S. Provisional Patent Application No. 62/181,957 filed on 19 Jun. 2015, which application is incorporated by reference as if fully set forth herein.

PARTIES TO A JOINT RESEARCH AGREEMENT

International Business Machines Corporation, a New York Corporation, and Macronix International Corporation, Ltd., a Taiwan corporation, are parties to a Joint Research Agreement.

BACKGROUND OF THE INVENTION

Field of the Invention

The present technology relates to high density memory devices based on phase change based memory materials.

Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

In phase change memory, data is stored by causing transitions in an active region of the phase change material between amorphous and crystalline states. For a one bit cell, the difference between the highest resistance $R_1$ of the low resistance crystalline set state and the lowest resistance $R_2$ of the high resistance amorphous reset state defines a read margin used to distinguish cells in the crystalline set state from those in the amorphous reset state. The data stored in a memory cell can be determined by determining whether the memory cell has a resistance corresponding to the low resistance state or to the high resistance state, for example by measuring whether the resistance of the memory cell is above or below a threshold resistance value within the read margin.

Phase change materials used for memory operations can be characterized by a number of different performance specifications including set and reset speeds, data retention, endurance, reset current and the probability that data stored using the material will survive solder bonding. The speed is a function of the pulse lengths required to cause the set and reset operations, as well as other factors. The data retention is a function, typically, of the tendency of the phase change material in the amorphous phase to crystallize over time and temperature so as to lose data. The endurance is a function of the phase change material tendency to become hard to set or hard to reset as the material is exposed to many set/reset cycles. The reset current has a value which is desirably low, but must be sufficient to cause heating in the active area sufficient to cause the phase transition, and can be higher as the resistance level of the set state is lower. The solder bonding specification refers to a difficulty that arises with phase change materials on integrated circuits that are mounted by solder bonding. The solder bonding process exposes the integrated circuit to elevated temperatures, which can exceed the crystallization transition temperature for the phase change materials. Thus, prior art phase change designs could not be programmed before being mounted by solder bonding.

It is desirable therefore to provide a phase change memory material with a higher crystallization transition temperature to prevent undesired transformation from the amorphous reset state to the crystallized set state at elevated operation temperatures. It is further desirable that the phase change memory material maintain a large difference between the range of reset state resistance values and the range of set state resistance values. It is also desirable that the phase change memory material retains fast set and reset speeds. It is also desirable that a phase change memory material have relatively higher resistance in the crystallized set state phase, to reduce the reset current. Furthermore, it is desirable that a phase change memory material have a crystallization transition temperature high enough to withstand solder bonding without loss of data.

SUMMARY

Phase change memory materials in a Ga—Sb—Ge family (gallium—Ga, antimony—Sb, germanium—Ge) of materials, are described that can have higher crystallization transition temperatures, reduced reset currents, faster switching and better retention characteristics than prior art materials. Materials described herein can have crystallization transition temperatures Tx high enough to satisfy solder bonding specifications.

The materials maintain a high crystallization transition temperature while having a fast set speed compared to GST-225 phase change memory material. The phase change memory materials described herein do not form large voids and do not retain large variations in grain size after exposure to elevated temperatures during back-end-of-line (BEOL) processing. Furthermore, the phase change memory materials described herein remain in the amorphous reset state after prolonged exposure to elevated temperatures.

A phase change material, comprising $Ga_xSb_yGe_z$, wherein a Ga atomic concentration x is within a range from 20% to 45%, an Sb atomic concentration y is within a range from 25% to 40% and a Ge atomic concentration z is within a range from 25% to 55%, is described wherein the material has a crystallization transition temperature Tx greater than 360° C. Adding impurities including one or more element selected from silicon Si, carbon C, oxygen O and nitrogen N, can also increase the crystallization transition temperature Tx to temperatures greater than 400° C., and also reduce reset current.

A phase change material within the Ga—Sb—Ge family is described that includes an Si atomic concentration within a range from 3% to 12% and an N atomic concentration within a range from 3% to 12% (normalized as discussed below). A phase change material within the Ga—Sb—Ge family is described that includes an Si atomic concentration within a range from 3% to 12% and an O atomic concentration within a range from 6% to 25% (normalized as discussed below). Also, combinations of added elements including silicon and carbon (Si, C) are described.

A phase change material within the Ga—Sb—Ge family is described that includes silicon oxide in an amount effective to establish a crystallization transition temperature Tx greater than 400° C.

A phase change material within the Ga—Sb—Ge family is described that includes silicon nitride in an amount effective to establish a crystallization transition temperature Tx greater than 400° C.

The phase change memory materials within the Ga—Sb—Ge family maintain a large difference in resistance between the higher resistance of the amorphous reset state and the lower resistance of the crystalline set state at elevated temperatures and after repeated operation cycles. Excellent data retention (220° C.-10 years) is achieved. Also, memory devices using this material can pass the solder bonding thermal budget test (260° C. for 30 seconds), suggesting PCM with new phase-change materials are suitable for embedded automotive applications, and for use in other high temperature environments.

The materials within the Ga—Sb—Ge family crystallize with a growth dominated mechanism as opposed to materials within the GST-225 family that crystallize through a nucleation dominated mechanism.

The memory devices include an array of memory cells. Each memory cell includes a first electrode and a second electrode coupled to a memory element. The memory element comprises a phase change material as described herein, and includes an active region in which the phase transformation between the set and reset states occurs, and that substantially determines the resistance of the memory cell.

Methods for manufacturing memory cell devices using a phase change memory material are described herein.

Other aspects and advantages of the present invention can be seen on review of the drawings, the detailed description, and the claims which follow.

DETAILED DESCRIPTION

A detailed description of embodiments of the present invention is provided with reference to the FIGS. 1-19.

Figure 1:
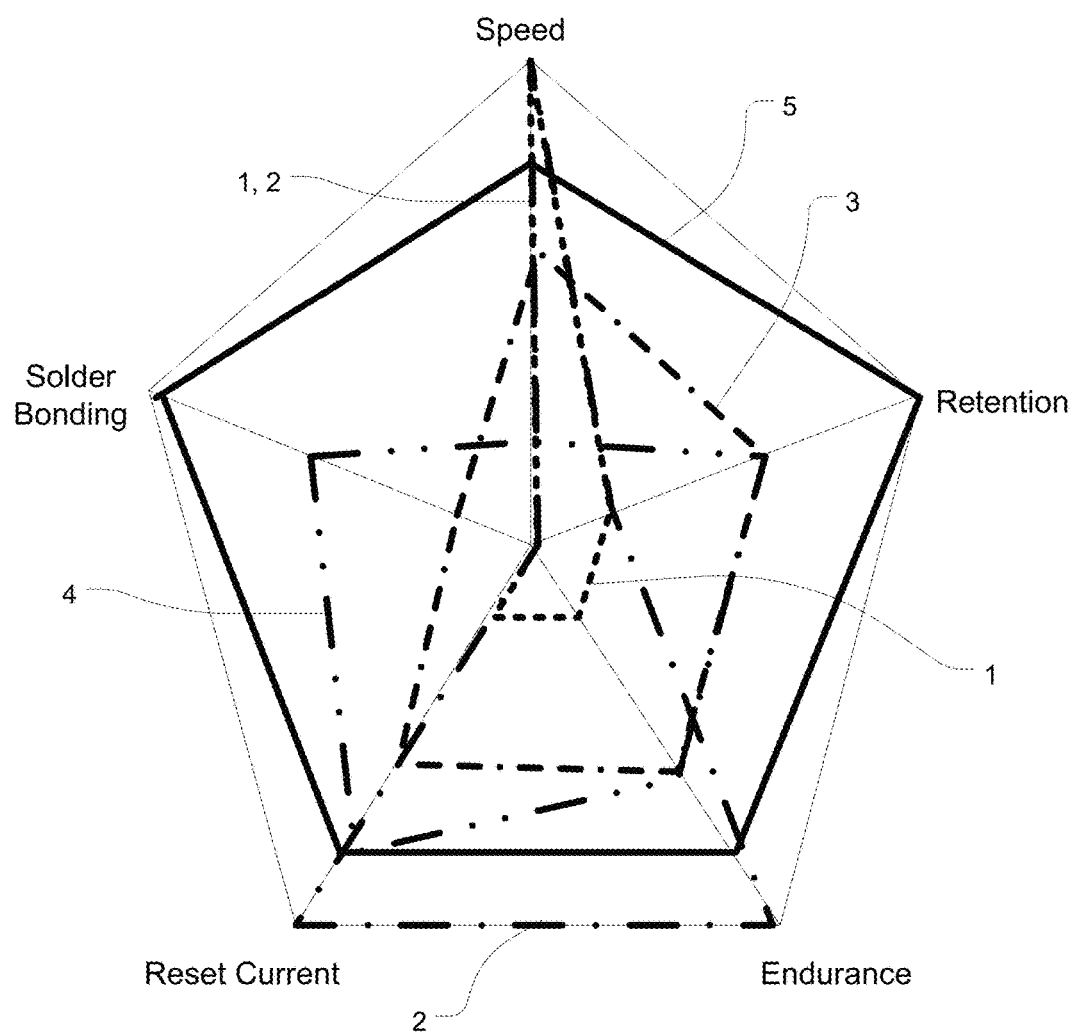
FIG. 1 is a heuristic diagram showing five performance specifications that can be considered, including speed, data retention, endurance, reset current and solder bonding, each plotted on one of the five corners of the chart.

FIG. 1 is a heuristic diagram showing five performance specifications that can be considered, including speed, data retention, endurance, reset current and solder bonding, each plotted on one of the five corners of the chart. In the chart of FIG. 1, materials in the GST-225 family are plotted for two types. The first type plotted on line 1 is made using conventional sputtering technologies. The second type plotted on line 2 (which overlaps with line 1 on the retention, speed and solder bonding axes) is made using advanced atomic level engineering. Also, in the chart of FIG. 1, the so-called "golden composition" as described in my paper, Cheng, et al., "A high performance phase change memory with fast switching speed and high temperature retention by engineering the $Ge_xSb_yTe_z$ phase change material," 2011 IEEE Int'l IEDM, 5-7 Dec. 2011, is plotted on line 3. A nitrogen doped, germanium rich modification of the "golden composition" as described in my paper, Cheng et al., "A thermally robust phase change memory by engineering the Ge/N concentration in $(Ge, N)_xSb_yTe_z$ phase change material" 2012 Int'l IEEE IEDM, 10-13 Dec. 2012, is plotted on line 4. A material in "GaSbGe family" described herein is plotted on line 5 of the chart in FIG. 1.

Materials within the GST-225 family include GeSbTe (germanium—Ge, antimony—Sb, and tellurium—Te) compositions along the $Sb_2Te_3$ and GeTe tie line as reported in "Structural, electric and kinetic parameters of ternary alloys of GeSbTe", E. Morales-Sanchez, Thin Solid Films 471 (2005) 243-247. It has been observed that conventional phase change memory cells fabricated from materials in the GST-225 family undergo undesired transformation from the amorphous reset state to the crystalline set state at elevated temperatures, limiting the data retention characteristics of memory cells using these materials. The undesired transformation of the phase change material within the active region of memory cells within an array at elevated operation temperatures leads to the creation of false data and the loss of desired stored data.

Efforts to improve the thermal stability of GST-225 phase change memory cells have resulted in memory cells that operate at slower set and reset speeds at higher reset currents with a decrease in the difference between the low resistance of the crystalline set state and the high resistance of the amorphous reset state.

In U.S. Patent Application Publication No. US 2015/0048291 A1, entitled PHASE CHANGE MEMORY CELL WITH IMPROVED PHASE CHANGE MATERIAL, published on Feb. 19, 2015, a Ga—Sb (gallium—Ga, antimony—Sb) system is described, along with the possibility of adding " . . . at least one of Tellurium (Te), Silicon (Si), Germanium (Ge), Arsenic (As), Selenium (Se), Indium (In), Tin (Sn), Bismuth (Bi), Silver (Ag), Gold (Au), and additional Antimony (Sb) . . . " to the system. The Ga—Sb system is described as beneficial because of small mass density changes between the amorphous and crystalline states. However, the materials disclosed had crystallization transition temperatures of about 265° C. (See, paragraph [0054]) of Publication No. U.S. Ser. No. 2015/0048291 A1), and limited data retention characteristics.

Figure 2:
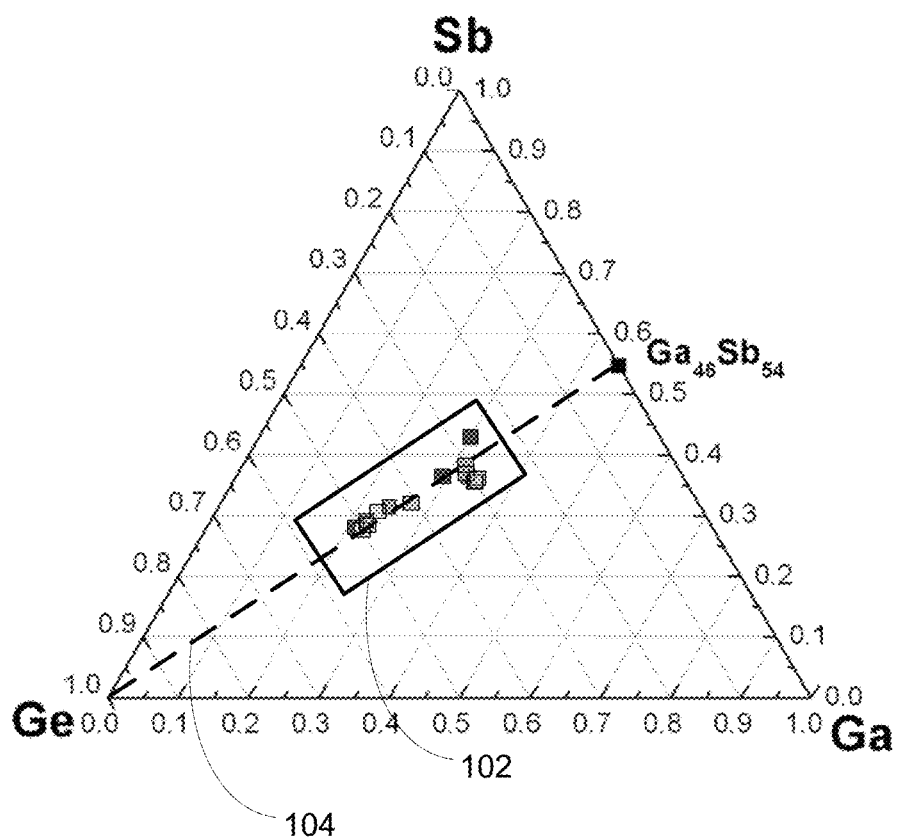
FIG. 2 is a ternary phase diagram with the crystallization transition temperature of Ga—Sb—Ge compositions, with and without doping materials, at various atomic percentage concentrations.

FIG. 2 is a ternary phase diagram that shows the crystallization transition temperature using gray scale coding of spots at locations that correspond to GaSbGe compositions at various atomic percentage concentrations. In one embodiment, the high crystallization transition temperature compositions described here are located generally along or near the Ge—$Ga_{46}Sb_{54}$ tie line 104, encompassing materials with concentrations similar to $Ga_1Sb_1Ge_1$, including doped GaSbGe. This tie line 104 represents tested materials, but is representative more generally of a Ge—$Ga_{50}Sb_{50}$ tie line, where the 50-50 atomic percentages may vary within plus or minus 10%.

A group of materials, termed herein the "GaSbGe family" of materials distributed along or near the tie line 104 includes the group of $Ga_xSb_yGe_z$ wherein the Ga atomic percentage concentration is within a range from 20% to 45%, the Sb atomic percent concentration is within a range from 25% to 40% and the Ge atomic percent concentration is within a range from 25% to 55%, in combinations effective to have a crystallization transition temperature greater than 360° C. The material can be on the $Ga_xSb_y$ tie line, where x and y in combination add to 100 and each falls in a range of 50 plus or minus 10%, and include an amount of Ge effective to provide a crystallization transition temperature Tx that is greater than 360° C. In addition, the materials described herein are operable with low reset currents, which can be around 50% lower than that typical for materials in the GST-225 family. The GaSbGe family of materials is illustrated in FIG. 2 as those materials with compositions that are within the area identified by the rectangle 102, that have combinations of Ga—Sb—Ge effective to provide crystallization transition temperatures above 360° C. A group of materials, termed herein the "GaSbGe family" of materials, some doped with impurities, distributed along or near the tie line 104 includes the group of $Ga_xSb_yGe_z$, wherein the Ga atomic percentage concentration is within a range from 20% to 45%, the Sb atomic percent concentration is within a range from 25% to 40% and the Ge atomic percent concentration is within a range from 25% to 55%.

Impurities can be added to comprise the Si atomic percentage concentration within a range from 3% to 12%, the O atomic percentage concentration within a range from 6% to 25%, or the N atomic percentage concentration within a range from 3% to 12%, including combinations effective to provide crystallization transition temperature greater than 400° C. and higher than the temperature required for the solder bonding process. The higher crystallization transition temperature of materials within the GaSbGe family leads to improved device performance and data retention. The material can be in the GaSbGe family, with Silicon and Oxygen added in amounts effective to provide a crystallization transition temperature greater than 400° C. The material can be in the GaSbGe family, with Silicon and Nitrogen added in amounts effective to provide a crystallization transition temperature greater than 400° C.

The GaSbGe family materials plotted in the FIG. 2 are listed in the following table.

| | Ga | Sb | Ge | Si | O | N | Tx |
|---|---|---|---|---|---|---|---|
| 1 | 45.45455 | 54.54545 | 0 | | | | 257 |
| 2 | 22.3 | 28.8 | 48.9 | | | | 380 |
| 3 | 29.5 | 36.4 | 34.1 | | | | 365 |
| 4 | 21.4 | 27.9 | 50.7 | — | — | | 372 |
| 5 | 24.46121 | 31.35776 | 44.18103 | 2.3 | 4.9 | | 383 |
| 6 | 27.16049 | 31.8743 | 40.96521 | 3.6 | 7.3 | | 450 |
| 7 | 23.22275 | 30.56872 | 46.20853 | 4.3 | 11.3 | | 441 |
| 8 | 22.83465 | 28.34646 | 48.8189 | 6.7 | 17.1 | — | 462 |
| 9 | 22.45575 | 27.43363 | 50.11062 | 2.2 | x | 1.6 | 445 |
| 10 | 30.2 | 42.8 | 27 | — | — | — | 370 |
| 11 | 33.3 | 36.2 | 30.5 | — | — | — | 371 |
| 12 | 32.29399 | 37.08241 | 30.62361 | 10.2 | — | — | 396 |
| 13 | 31.81126 | 37.89954 | 30.28919 | 7.1 | 27.2 | — | 391 |
| 14 | 34.29752 | 35.53719 | 30.16529 | 7.6 | x | 8.8 | 500 |
| 15 | 34.67279 | 35.8209 | 29.50631 | 3.2 | 9.7 | — | 427 |

In the table above, and in FIG. 2, the concentrations of Ga, Sb and Ge are normalized so that in combination they add to 100%, even when additional elements of Si, O and N are added. The concentrations of the additional elements are not normalized, considering their atomic concentration, assuming that the Ga, Sb and Ge add to 100%, so that the sum of concentration percentages as normalized are higher than 100%. Thus, at the circumstance with additional elements, such as Si, O, and N, the actual atomic concentrations (adding to 100%) therefore can be determined by scaling the values in the columns for Ga, Sb and Ge by the factor ((100−sum of added elements)/100). For material 5, for example, the actual Ga, Sb and Ge values must be scaled by (92.8/100), and so do the Si and O values, then the sum of all elements will be 100% within measurement uncertainty of a few percent.

The crystallization transition temperature Tx as used herein is the crystallization transition temperature measured using an as-deposited thin film of the material, as opposed to the material in situ of a memory device, which will have been subjected to back end of line processing and one or more melt-quench cycles. In measurement of the transition temperature of an as-deposited thin film, the thin film can be on the order of 50 to 100 nm thick, but resistivity measurement processes are the same for differences in thickness of the as-deposited film.

The as-deposited thin film crystallization transition temperature Tx can be 50 to 100° C. higher than the in situ transition temperature Tx, where the amount of variation between the as-deposited and in situ forms varies for different materials, and for different configurations of memory cells using the same materials, and for other reasons. Thus, to achieve a given operating specification applied to the in situ memory element, the crystallization transition temperature Tx as used herein must be much higher than the specification.

An important factor for developing new phase change materials is the resistance of phase change materials. The resistance in the crystalline state is important in particular, because it is a determinative factor in the magnitude of reset current, which the device requires. For GST-225, the resistance in the crystalline state is very low, so it needs very high reset current for reset. Unlike the GST-225 family, the GaSbGe family shows that the Ge concentration can be effective to increase resistance of crystalline state, and therefore lower reset current it is required.

Comparing with GST-225, the GaSbGe family is the material with high crystallization transition temperature Tx, and high dynamic resistance at its melting point, which combine to result in low reset current, and good endurance while maintaining a fast enough speed.

A representative GaSbGe material doped with silicon oxide (material 7 in the table above) shows excellent characteristics in testing, with an atomic percentage concentration of Ga around 19.6%+/−1%, an atomic percentage concentration of Sb around 25.8%+/−0.5%, an atomic percentage concentration of Ge around 36.6%+/−1%, an atomic percentage concentration of Si around 4.3%+/−0.5%, and an atomic percentage concentration of 0 around 11.3%+/−1% (hereinafter "material 7"). The improved performance characteristics of such material 7 include a crystallization transition temperature of around 441° C. The increased crystallization transition temperature improves data retention and device performance at elevated temperatures.

Figure 3:
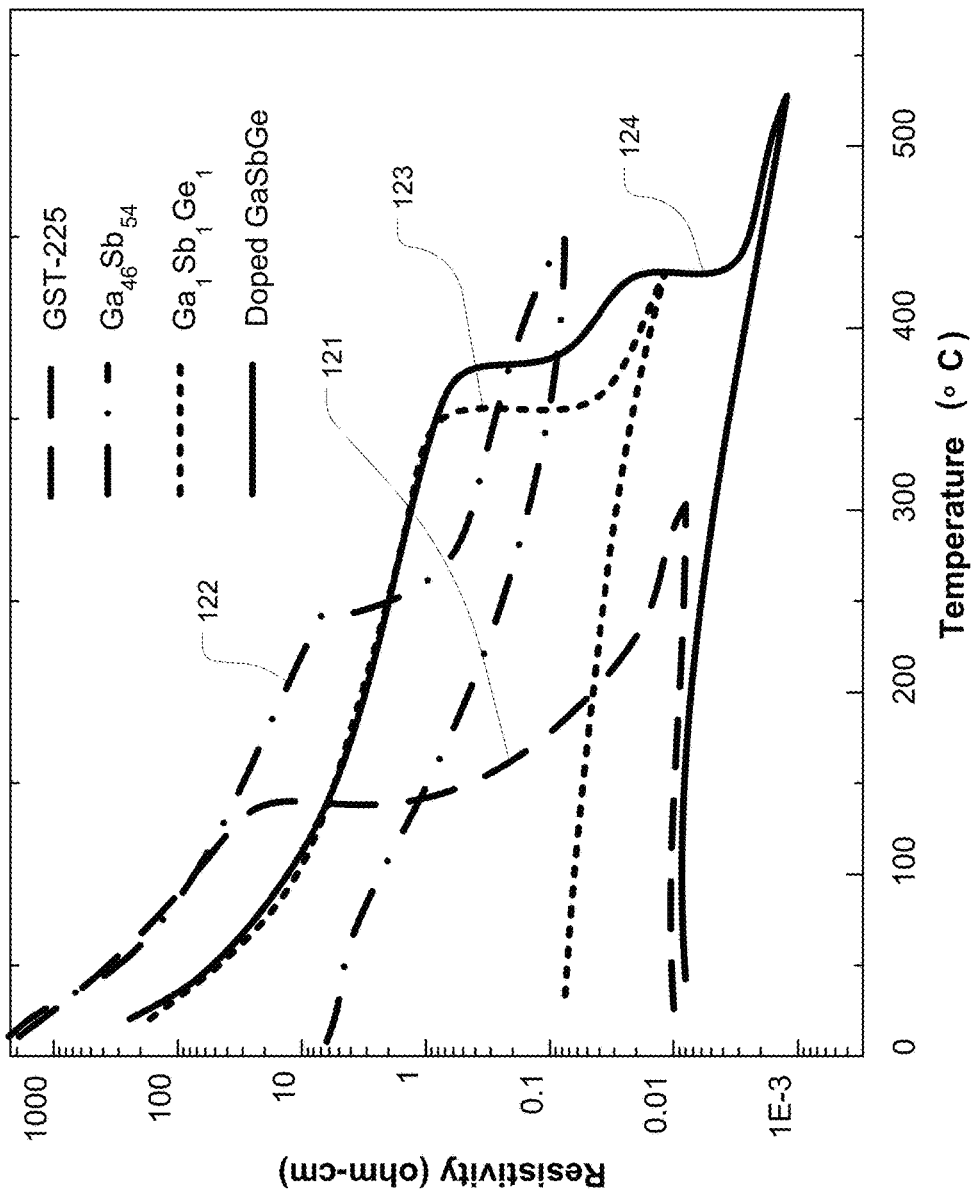
FIG. 3 is a diagram that illustrates the resistivity of materials with the GaSbGe family and the GST-225 family as a function of temperature.

FIG. 3 compares the resistivity vs. temperature curves for as deposited thin films of the GST-225 (trace 121), $Ga_{46}Sb_{54}$ (trace 122), $Ga_1Sb_1Ge_1$ (trace 123), and material 7—GaSbGe doped with silicon oxide (trace 124) compositions. The resistivity of GST-225 121 begins to dramatically decrease at a temperature of around 150° C. This shows that the crystallization transition temperature of GST-225 is around 150° C. The resistivity of $Ga_1Sb_1Ge_1$ 123 begins to dramatically decrease at around 360° C., indicating that the crystallization transition temperature of $Ga_1Sb_1Ge_1$ 123 is around 360° C. This is nearly a 210° C. higher crystallization transition temperature than GST-225, thus achieving desired performance characteristics and improved data retention at elevated temperatures. The resistivity of the material 7 (doped GaSbGe) on trace 124 begins to dramatically decrease at 441° C. Also, the resistivity in the set state for material 7 as seen on trace 124 is much lower than that of $Ga_{46}Sb_{54}$, and that of $Ga_1Sb_1Ge_1$.

The reset current that is required to transform materials of the GaSbGe family from a crystalline set state to an amorphous reset state is around 50% less than the reset current for materials within the GST-225 family The reset current is the amount of current that is required to transform the phase change memory material from a crystalline set state to an amorphous reset state. This reset current changes the temperature of a phase change memory material to a melting temperature, so that a portion of the crystallized material melts. The melted portion of phase change material quenches quickly, solidifying into an amorphous reset state.

The set current is the amount of current that is required to transform the phase change memory material from an amorphous reset state to a crystalline set state. The set current causes the phase change memory material to rise above the crystallization transition temperature but below the melting temperature, so that the phase change memory material crystallizes from the amorphous reset state.

The materials within the GaSbGe family, with or without doping materials, have a higher dynamic resistance at melting temperature than materials in the GST-225 family. Thus, a lower reset current is required to transform the materials from the set crystalline state to the reset amorphous state. Therefore the materials within the GaSbGe family can have a 50% lower reset current than those materials within the GST-225 family.

The materials within the GaSbGe family are not likely to form a large number of voids during back-end-of-line (BEOL) processing as compared with the materials within the GST-225 family. Such voids that are introduced during BEOL processing trigger crystallization of amorphous material within the reset state at even lower temperatures, continuously throughout the set and reset cycles associated with typical memory cell device performance. Thus, such voids further degrade desired performance characteristics by decreasing data retention rates and increasing the chances that false data is stored.

Furthermore, large grain size variations are not created for materials within the GaSbGe family during BEOL processing as are created for materials within the GST-225 family during BEOL processing. Such variation in grain sizes further serves to introduce defects within the material after repeated transformations between set and reset states during device operation. Such defects, as mentioned previously, trigger crystallization of amorphous phase change material, thereby degrading performance characteristics.

The formation of voids and large variations in grain size during BEOL processing is attributed to the transition from the cubic crystalline structure to the hexagonal close packed (HCP) crystalline structure at the elevated temperatures of BEOL processing. The large column-like structure of materials within the GST-225 family in the HCP structure promotes creation of large voids and variations in the grain sizes within the material. Time-resolved XRD data as a function of temperature for the material 7 shows that at 490° C., the material has a single zincblende phase structure. For purposes of comparison, for materials within the GST-225 family, the transition from a cubic crystalline structure to a HCP structure occurs at around 380° C., while materials within the GaSbGe family still maintain amorphous state at around 380° C. Since BEOL processing occurs at temperatures around 400° C., materials within the GaSbGe family having effective combinations to provide a crystallization transition temperature of near 400° C. and higher, do not transform into a crystalline HCP structure while materials within the GST-225 family do. Thus the voids and variations in grain size that are characteristic of materials with crystalline HCP structure are not present in the GaSbGe family of materials after BEOL processing.

Figure 4A:
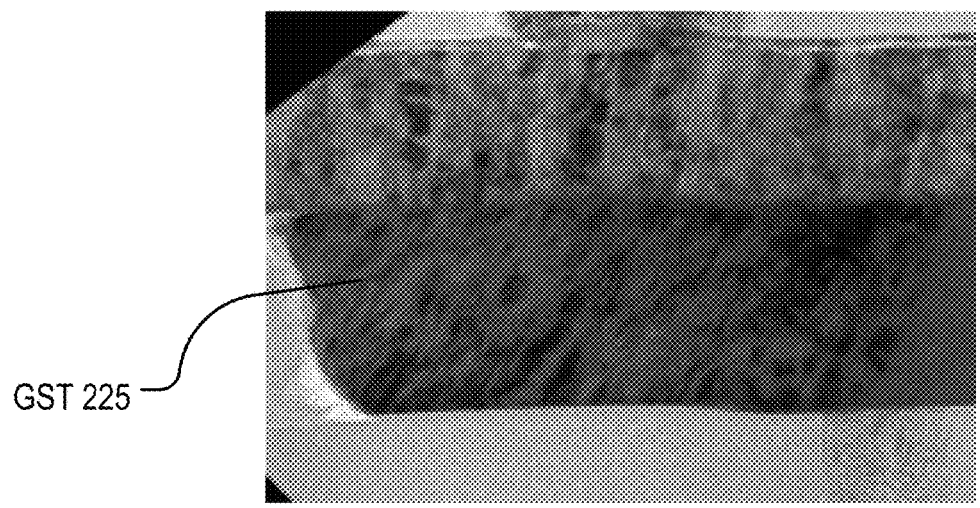
FIG. 4A is a transmission electron microscope (TEM) image of a material within the GST-225 family after back-end-of-line processing.
Figure 4B:
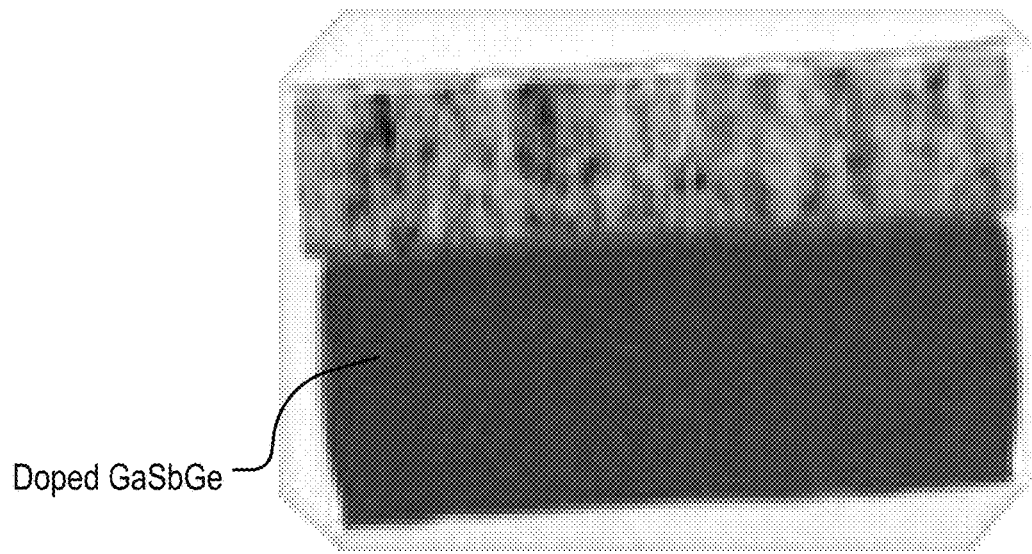
FIG. 4B is a TEM image of a material within the GaSbGe family after BEOL processing.

FIG. 4A is a transmission electron microscope (TEM) image of a material within the GST-225 family after BEOL processing. FIG. 4B is a TEM image of the material 7 after BEOL processing. FIG. 4A exhibits huge and non-uniform grains in the material within the GST-225 family. The image of the representative material 7 in FIG. 4B shows very dense and uniform morphology of amorphous state. Furthermore it is apparent from the TEM analysis that there are large variations in grain size within in the material in the GST-225 family. Such large variations in grain size are not present in the material in the GaSbGe family, where the morphology remains the amorphous state. Thus, after BEOL processing, defects including voids and large variations in grain size are not present in the material 7 from the GaSbGe family having the effective combinations described herein. This, in turn, improves device performance and reduces the chances of loss of data and of creation of false data. Further, it helps making the subsequent etching more uniform and less damaging.

The activation energy for the material within the GST-225 family is 2.65 eV, measured by the Kissinger method. The activation energy refers to the amount of thermal energy required to start the transformation from the crystalline set state to the amorphous reset state. Thus, the higher activation energy is indicative of the higher crystallization transition temperature and better data retention.

Laser melt/quench processing was conducted for the material within the GST-225 family and for the material 7. A laser pulse of 150 ns/5 W was sufficient to generate a transformation from an amorphous reset state to a crystalline set state for the material within the GST-225 family. A laser pulse of 150 ns/7 W was sufficient to generate a transformation from an amorphous reset state to a crystalline set state for the material 7. Such 100 ns laser pulse width is comparable to the pulse time, around 120 ns, for transforming material from the GaSbGe family from an amorphous reset state to a crystalline set state.

Schmoo plot analysis was conducted for memory cells comprising the material 7. The analysis shows crystalline set state resistance of 100 k$\Omega$ is achieved in as little as an 80 ns set pulse width using a square pulse shape. The 80 ns set pulse width of materials within the GaSbGe family is comparable to the set speed in devices fabricated from materials within the GST-225 family.

Figure 5:
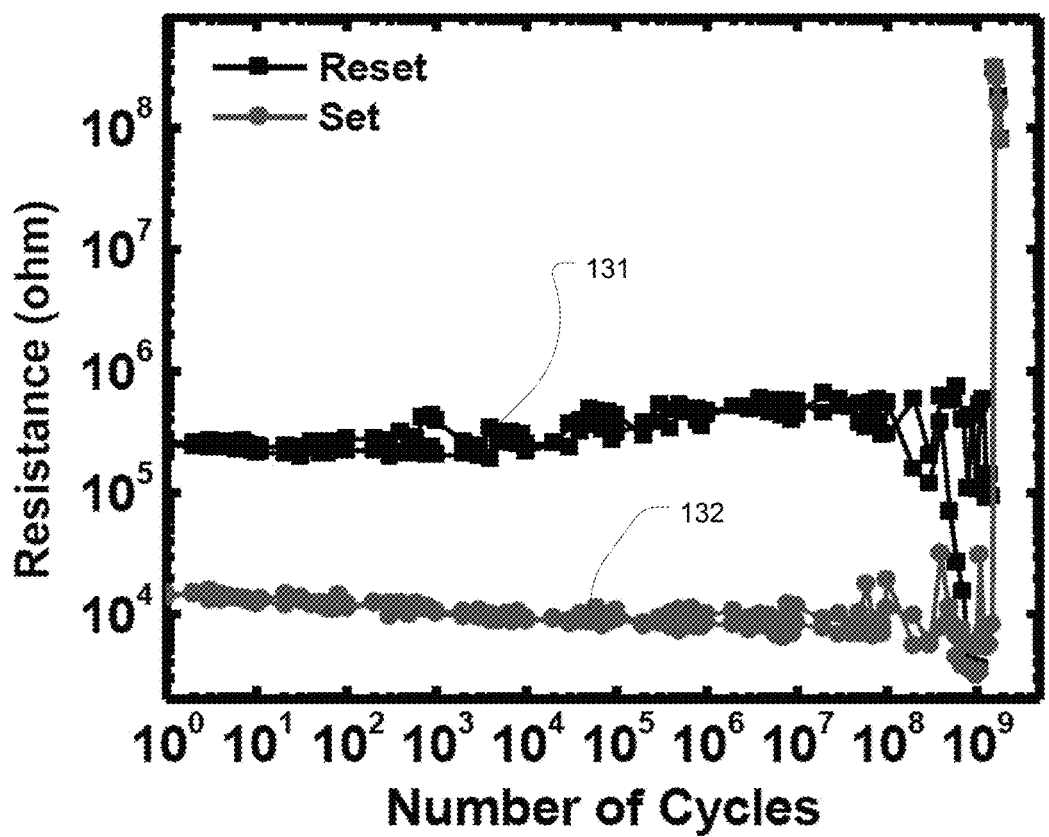
FIG. 5 is the resistance of cells in both the crystalline set state and the amorphous reset state as a function of operational cycles of a memory cell fabricated of a material from the GaSbGe family.

FIG. 5 shows the endurance in cell resistance in both the crystalline set state (samples 132) and the amorphous reset state (samples 131) as a function of the number of set/reset cycles (transforming the memory cell between a set state and a reset state in each cycle), for the representative material 7 within the GaSbGe family. As shown in FIG. 5, at normal operating temperatures, memory cells fabricated from materials within the GaSbGe family do not experience significant changes in resistance values for either the set or the reset states during $10^8$ cycles or more.

Figure 6:
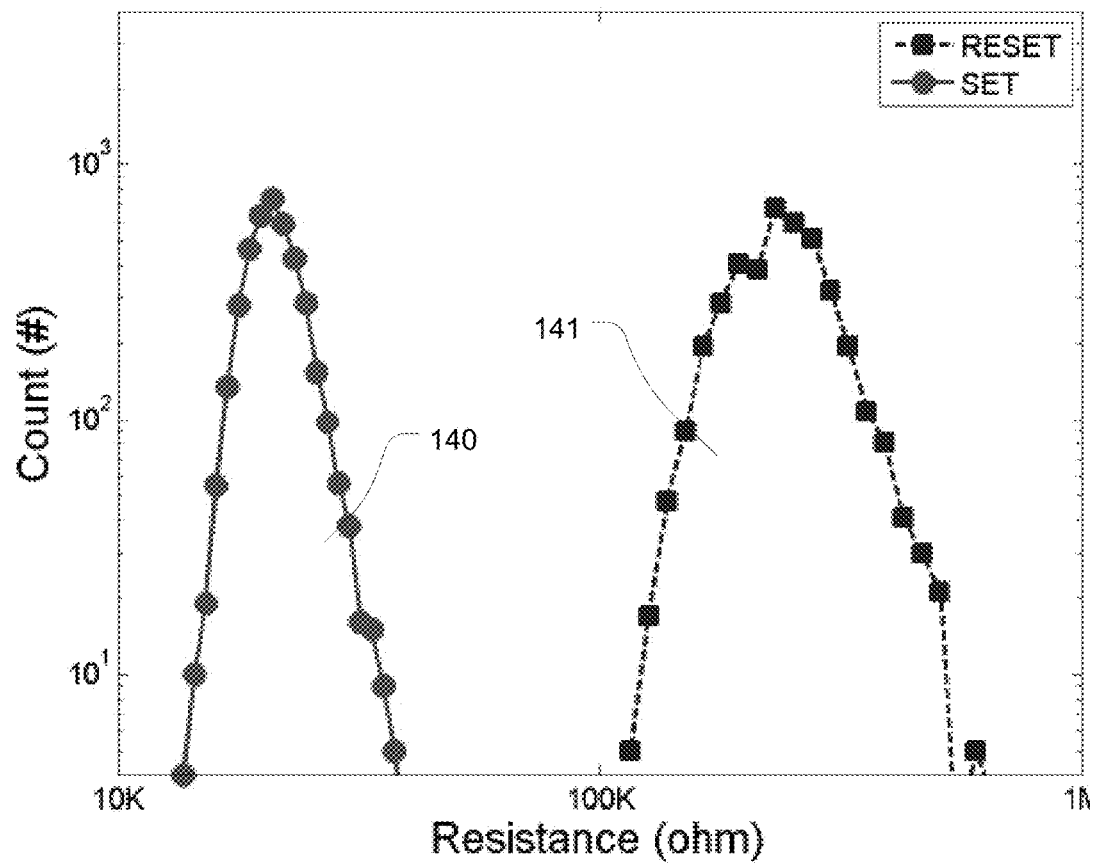
FIG. 6 is a plot of the bit counts of a memory cell fabricated from a material with optimum performance characteristics from the GaSbGe family as a function of resistance.

FIG. 6 shows the bit counts as a function of resistance of a 4K array of memory cells fabricated from the material 7 with an atomic percentage concentration of Ga around 19.6%, an atomic percentage concentration of Sb around 25.8%, an atomic percentage concentration of Ge around 39.0%, an atomic percentage concentration of Si around 4.3%, and an atomic percentage concentration of O around 11.3%. The variations in crystalline set state resistance values are confined to a range 140 between about 10 k$\Omega$ and 50 k$\Omega$. Meanwhile the variations in amorphous reset state resistance values are confined to a range 141 between about 100 k$\Omega$ and 750 k$\Omega$. Such distribution of resistance values within confined and separated ranges, further illustrates the previously mentioned desired performance characteristic, wherein the set and reset state resistance values remain separate and relatively constant within a range after numerous operational cycles.

Figure 7A:
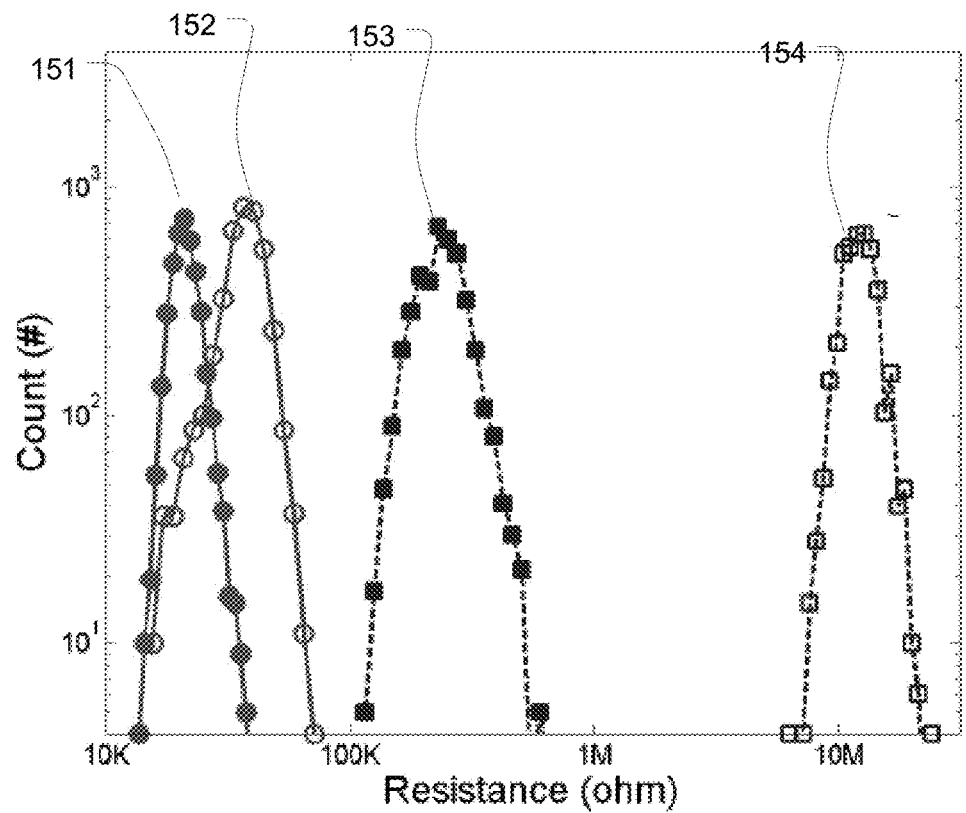
FIG. 7A is a plot of the bit counts of a memory cell fabricated from a material with optimum performance characteristics from the GaSbGe family as a function of resistance for before and after the soldering reflow process.

Memory cells fabricated from materials within the GaSbGe family maintain high data retention levels and have low instances of data loss after exposure to high temperatures after the soldering reflow process. FIG. 7A illustrates the bit counts as a function of resistance for an array of memory cells fabricated from the material 7 for set state before (distribution 151) and after (distribution 152) the soldering reflow process, and for the reset state before (distribution 153) and after (distribution 154) the soldering reflow process. The memory cells used to generate the data of FIG. 7A are the same as those that were used to generate the data for FIGS. 5 and 6.

Figure 7B:
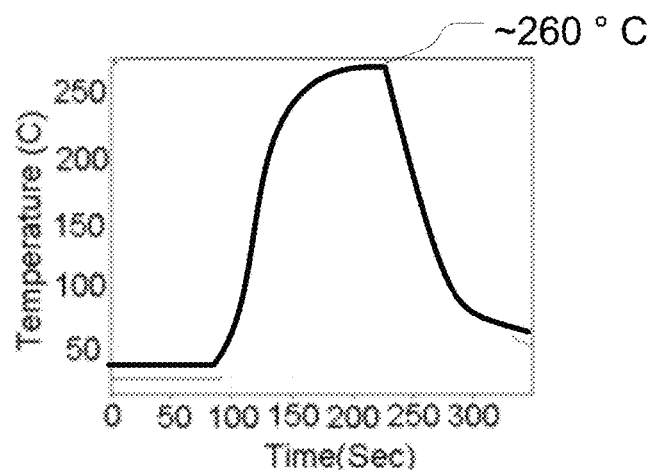
FIG. 7B illustrates the heating profile of the soldering reflow process

FIG. 7B illustrates heuristically the heating profile of the soldering bonding (or reflow) process. As shown in FIG. 7A, after soldering, the reset resistance distribution 154 after reflow is more than one order of magnitude higher than distribution 153 before reflow. Also, the set resistance distribution 152 after reflow is slightly higher than the set distribution 151 before reflow. However, good margins were maintained, avoiding loss of data during the solder process. The specification for withstanding solder reflow processing requires that the data be retained when the memory is exposed to 260° C. for 30 seconds.

Figure 8:
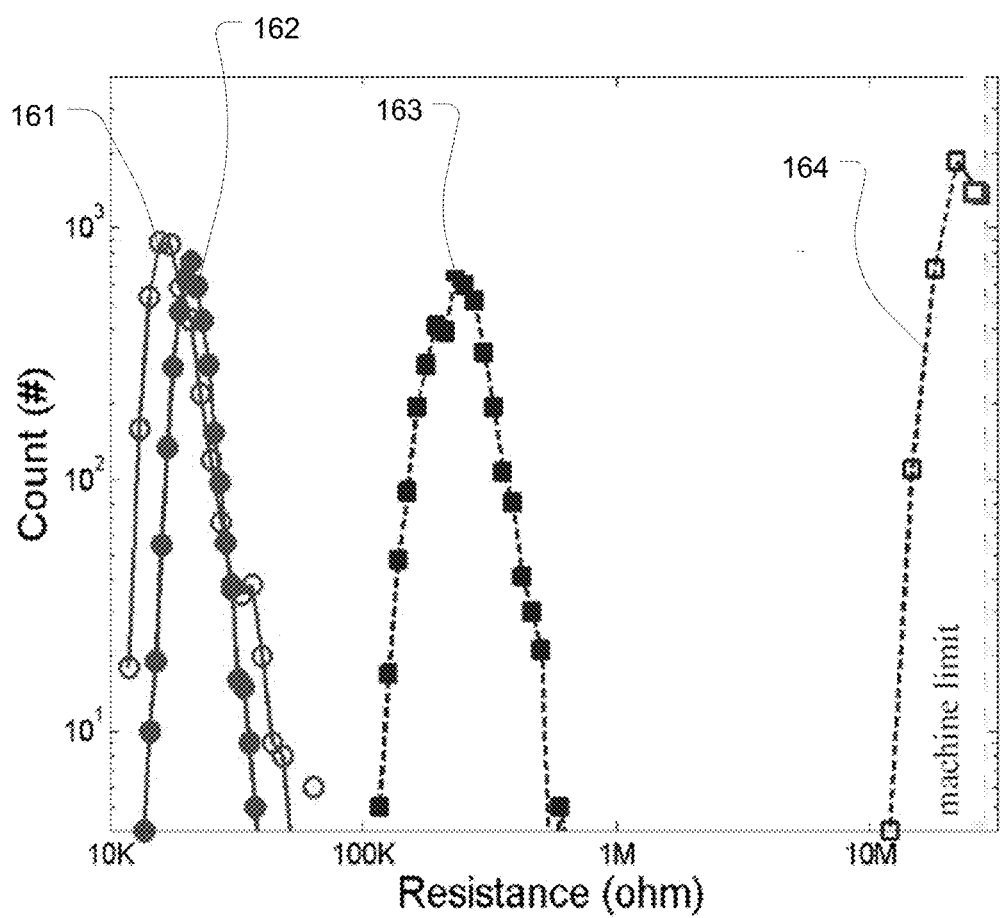
FIG. 8 is a plot of the bit counts of a memory cell fabricated from a material from the GaSbGe family as a function of resistance before and after exposure to 250° C. for 300 hours.

FIG. 8 illustrates the bit counts as a function of resistance for an array of memory cells fabricated from the material 7 for before (set distribution 161 and reset distribution 163) and after (set distribution 162 and reset distribution 164) baking at 250° C. for 300 hours. The graph shows that data retention is superb, with the resistance range of the set state cells (distribution 162) remaining well below 100K ohms, below the low end of the resistance range for the reset state (distribution 164). Testing has shown that those memory cells can retain data after being baked at 270° C. for 1 day, with the RESET distribution remaining similar to RESET distribution in FIG. 7.

Figure 9:
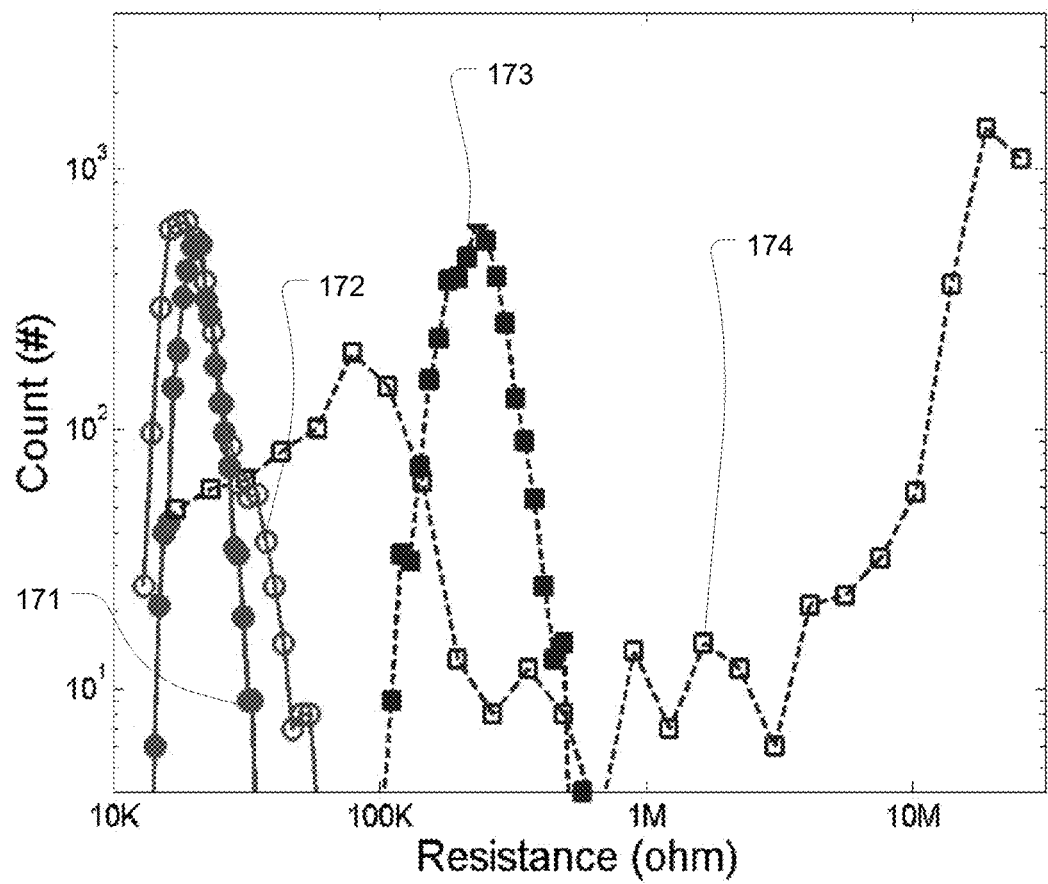
FIG. 9 is a plot of the bit counts of a memory cell fabricated from a material from the GaSbGe family as a function of resistance before and after exposure to 270° C. for 7 days.

FIG. 9 illustrates the bit counts as a function of resistance for an array of memory cells fabricated from the material 7 for before (ranges 171 and 173) and after (ranges 172 and 174) baking at 270° C. for 7 days, showing that the set distribution remains reasonably constant, but that recrystallization of the amorphous reset state causes data loss (as seen on trace 174) under these extreme conditions. However, the ability to withstand being baked at 270° C. for 1 day has been demonstrated, with the RESET distribution remaining similar to RESET distribution in FIG. 7. Thus, this family of materials, and particularly the GaSbGe family doped with silicon oxide, demonstrates unexpected, and dramatically improved characteristics for use as a memory material.

Figure 10A:
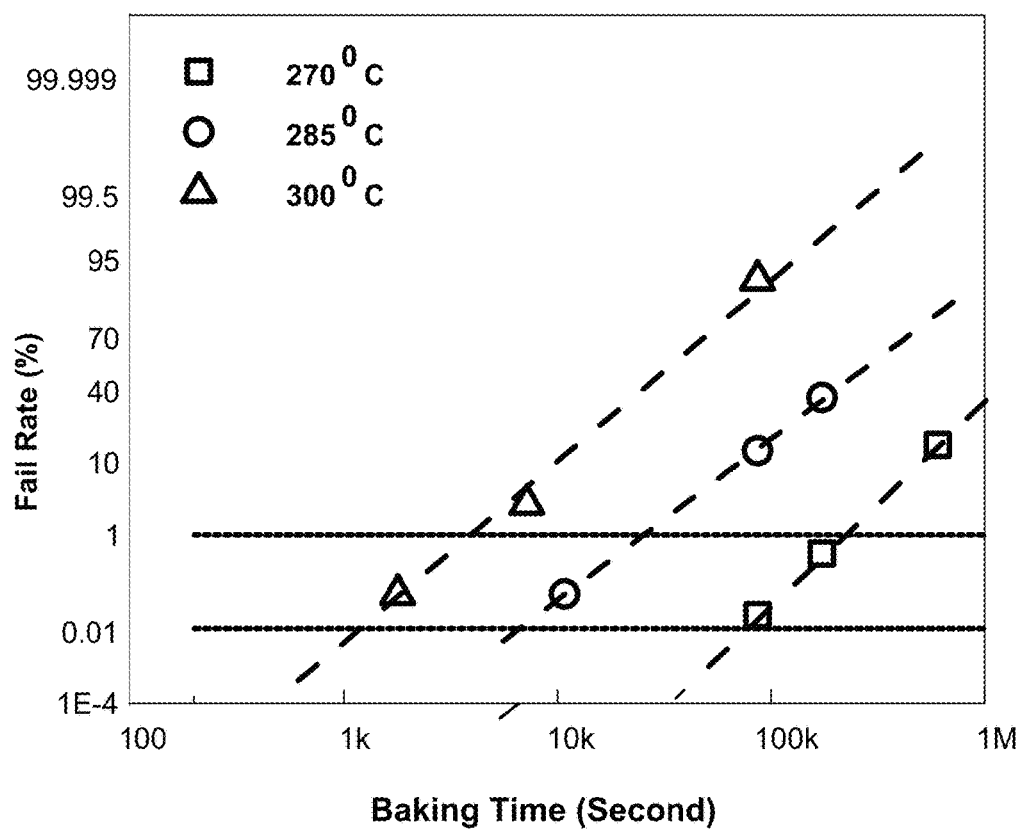
FIG. 10A illustrates the failure rate of a memory cell fabricated from a material from the GaSbGe family as a function of baking time for various baking temperatures.
Figure 10B:
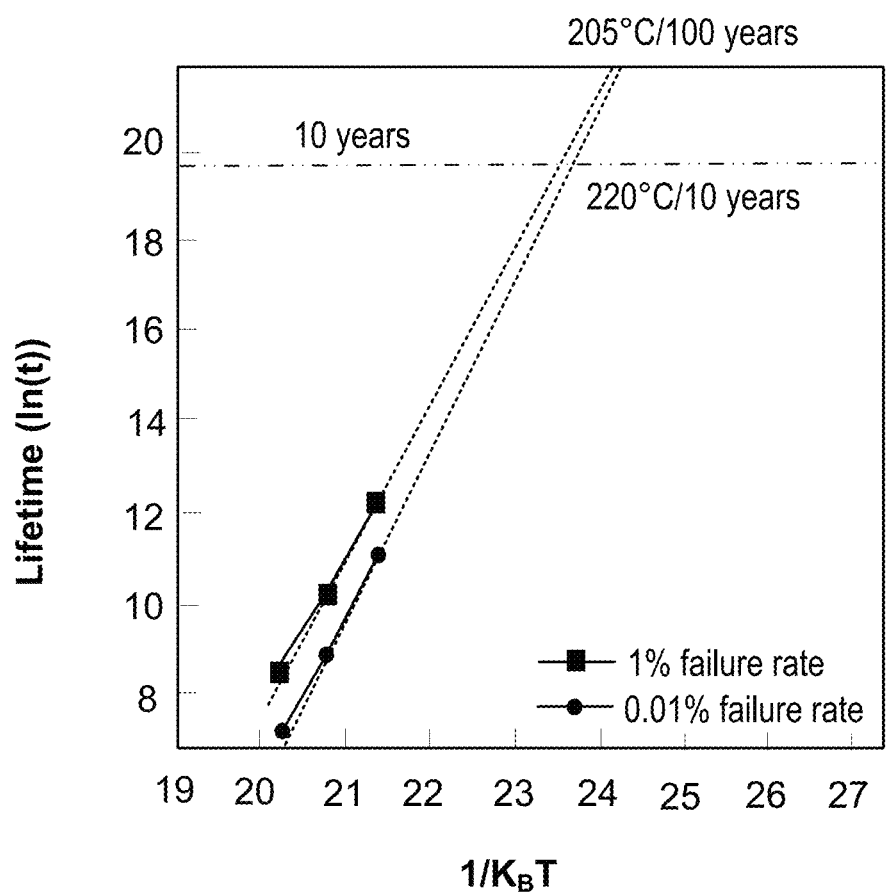
FIG. 10B illustrates the lifetime of a memory cell fabricated from a material from the GaSbTe family as a function of baking temperature for different failure rates.

FIG. 10A illustrates the failure rate as a function of baking time for an array of memory cells fabricated from the material 7 for baking temperatures of 270° C., 285° C. and 300° C. FIG. 10B illustrates the lifetime as a function of baking temperature for the failure rates at 1% and 0.01%. Based on the lifetime at different baking temperatures, the activation energy of material 7 can be calculated as 3.3 eV. As is seen in FIG. 10B, at 0.01% failure rate the lifetime is projected 10-year retention at 220° C., which is suitable for automotive applications.

Memory cells fabricated from the GaSbGe family are capable of maintaining amorphous reset state resistance values during repeated cyclical operation of the memory cells at exposure to elevated temperatures for long periods of time.

Figure 11:
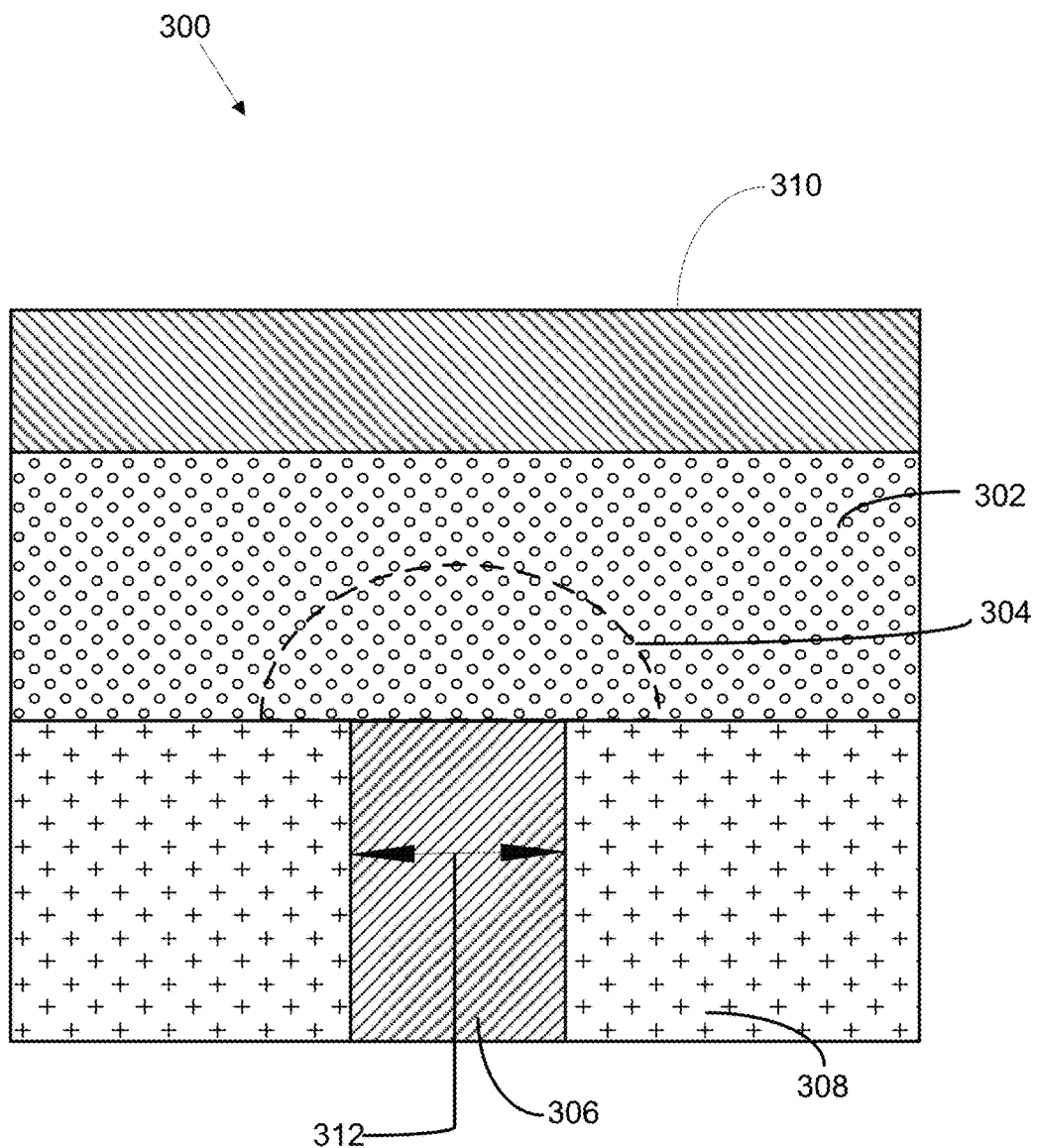
FIG. 11 is a cross-sectional view of a memory cell with a memory element that is made from a material with a bulk stoichiometry of a material from the GaSbGe family.
Figure 12:
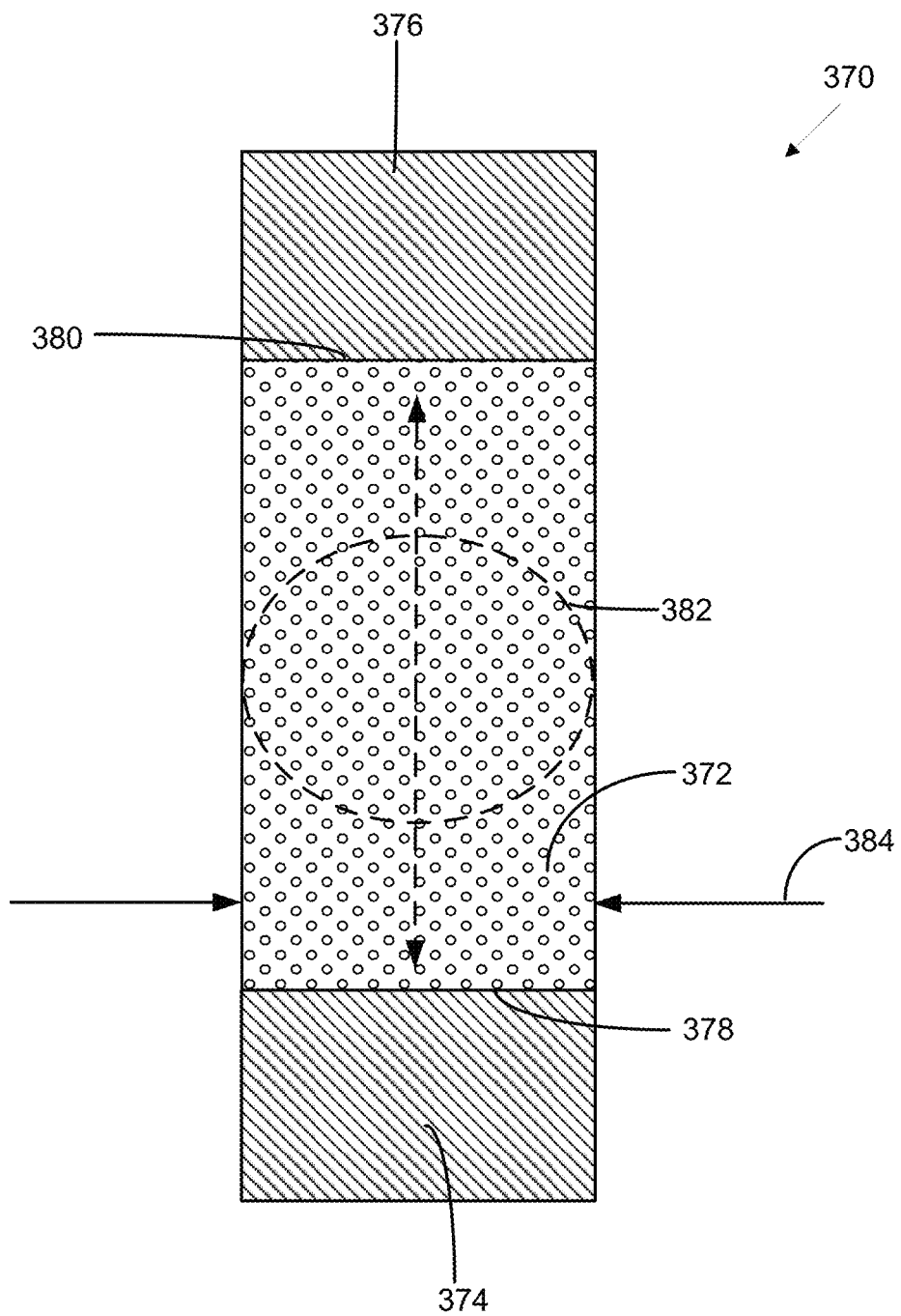
FIG. 12 is a cross-sectional view of an alternative memory cell design with a memory element that is made from a material with a bulk stoichiometry of a material from the GaSbGe family.
Figure 13:
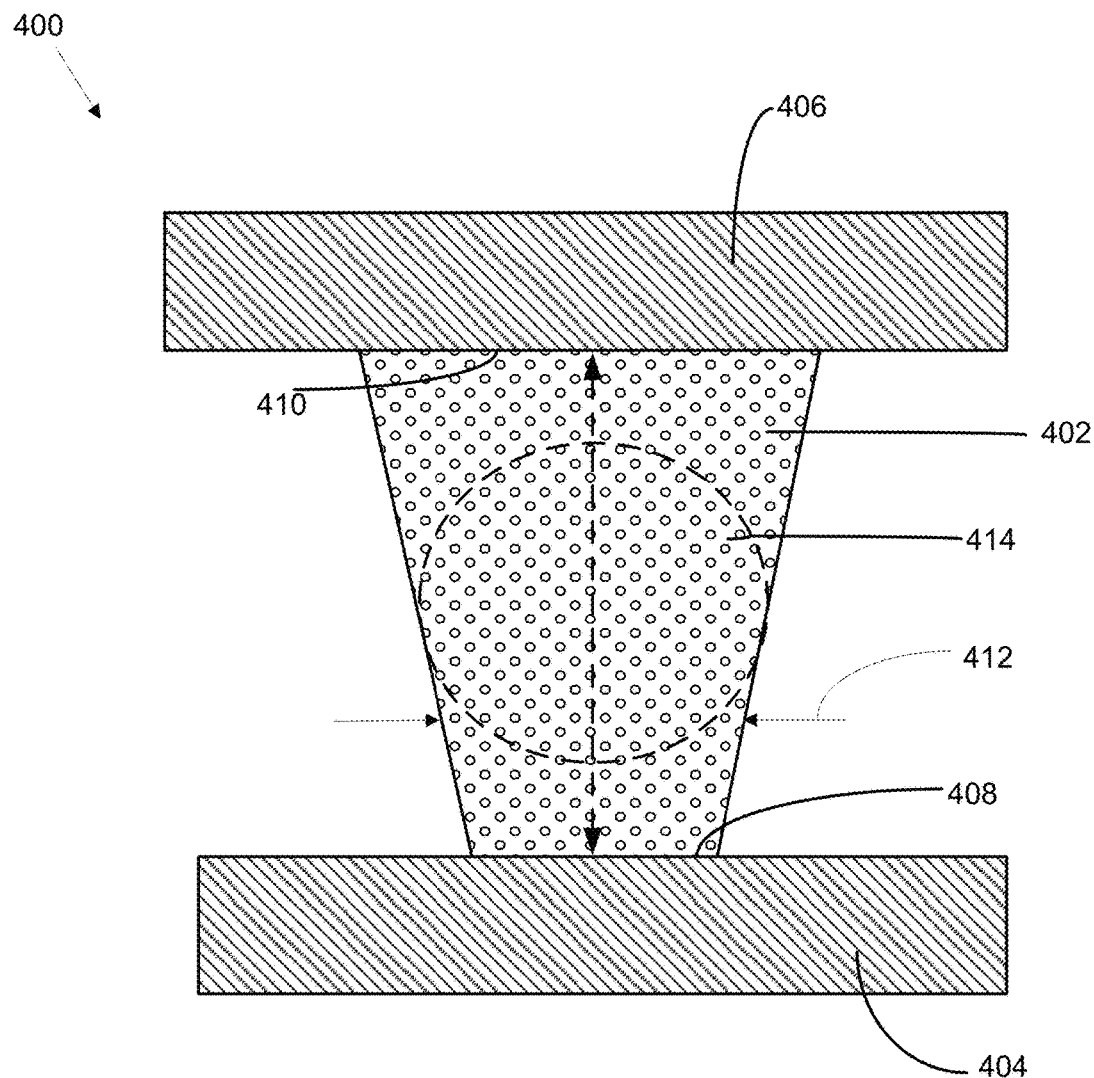
FIG. 13 is a cross-sectional view of an alternative memory cell design with a memory element that is made from a material with a bulk stoichiometry of a material from the GaSbGe family.

Phase change memory cells can be formed in a number of ways, some example forms of which are shown in FIGS. 11-13, each cell including a memory element comprising GaSbGe material as described herein.

FIG. 11 illustrates a cross-sectional view of a memory cell 300 that is fabricated from a GaSbGe material. The memory cell 300 comprises a memory element 302 consisting of a body of memory material in the GaSbGe family. The memory cell 300 includes an active region 304. The memory cell 300 includes a first electrode 306 extending through dielectric layer 308 to contact a bottom surface of the memory element 302. A second electrode 310 is formed on the memory element 302 to create a current between the first electrode 306 and second electrode 310 through the memory element 302. The first and second electrodes 306 and 310 may comprise, for example, TiN or TaN. Alternatively, the first and second electrodes 306 and 310 may each be W, WN, TiAlN or TaAlN, or comprise, for further examples, one or more elements selected from the group consisting of doped-Si, Si, C, Ge, Cr, Ti, W, Mo, Al, Ta, Cu, Pt, Ir, La, Ni, N, O, and Ru and combinations thereof. The dielectric layer 308 may comprise silicon nitride, silicon oxynitride, silicon oxide and any other suitable dielectric material.

The described memory cell has a first electrode 306 with a relatively narrow width 312 (which in some embodiments is a diameter). The narrow width 312 of the first electrode 306 results in an area of contact between the first electrode 306 and the memory element 302 that is less than the area of contact between the memory element 302 and the second electrode 310. Thus, current is concentrated in the portion of the memory element 302 adjacent the first electrode 306, resulting in the active region 304 being in contact with or near the first electrode 306, as shown. The memory element 302 also includes an inactive region outside the active region 304, which is inactive in the sense that it does not undergo phase transitions during operation. Even though the inactive region outside of the active region 304 does not undergo phase transformations during device operation the bulk stoichiometry of the entire memory element including the active region 304 and the inactive region is comprised of GaSbGe phase change memory material.

FIG. 12 illustrates a cross-sectional view of an alternative memory cell 370 design. Memory cell 370 includes a memory element 372 consisting of a body of phase change material from the GaSbGe family in an inter-electrode current path through memory element 372. The memory element 372 is in a pillar shape and contacts first and second electrodes 374 and 376 at top and bottom surfaces 378 and 380, respectively. The memory element 372 has a width 384 substantially the same as that of the first and second electrodes 374 and 376 to define a multi-layer pillar surrounded by dielectric (not shown). As used herein, the term "substantially" is intended to accommodate manufacturing tolerances. In operation, as current passes between the first and second electrodes 374 and 376 and through the memory element 372, the active region 382 heats up more quickly than the other regions within the memory element. This leads to a majority of the phase transformation occurring within the active region during device operation.

FIG. 13 illustrates a cross-sectional view of an alternative memory cell 400 design. The memory cell 400 includes a memory element 402 consisting of a body of phase change material from the GaSbGe family in an inter-electrode current path through the memory element 402. The memory element 402 is surrounded by dielectric (not shown) contacting first and second electrodes 404 and 406 at top and bottom surfaces 408 and 410, respectively. The memory element 402 has a varying width 412 that is always less than the width of the first and second electrodes. In operation, as current passes between the first and second electrodes 404 and 406 and through the memory element 402 the active region 414 heats up more quickly than the remainder of the memory element. Thus the volume of memory element 402 within the active region is where a majority of the phase transformation occurs during device operation.

As will be understood, the memory material from the GaSbGe family, as described herein, can be used in a variety of memory cell structures and is not limited to the memory cell structures described herein.

Figure 14:
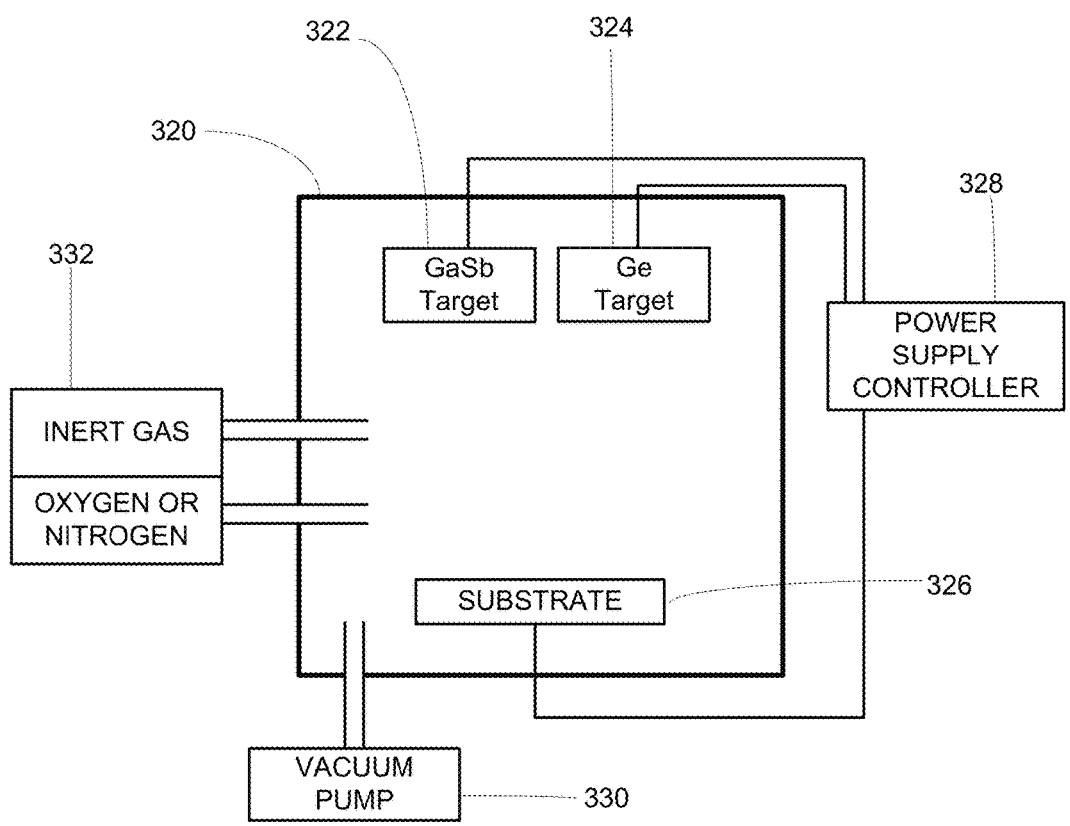
FIG. 14 is a simplified diagram of a system for forming a GaSbGe memory device through sputtering.

FIG. 14 is a simplified diagram of a method of creating a GaSbGe memory device through a sputtering system. The sputtering system includes a chamber 320 in which a GaSb sputter target 322, a Ge sputter target 324 and a substrate 326 are mounted. The sputter targets 322 and 324 and substrate 326 are coupled to a power supply and controller 328 that are used to apply bias voltages during the sputtering process. Bias voltages applied can be DC, pulsed DC, radio frequency, and combinations thereof, and turned on and off and modulated by the controller, as suits a particular sputtering process. The sputter chamber 320 is equipped with a vacuum pump 330 or other means for evacuating the chamber and removing exhaust gases. Also, the chamber is configured with a gas source 332. In one embodiment of the present invention the gas source 332 is a source for an inert gas such as argon. In addition, some embodiments may include a gas source 332 of the reaction gas, such as oxygen or nitrogen in the examples for use in causing addition of other components in the bulk GaSbGe. The system has the ability to dynamically control the flow of gases from the source 332 in order to have an effect on the composition of the layer being formed in the sputtering process. The power applied the power supply and controller 328 to the Ge sputter target 324 can be used to control the composition of the as deposited layer, so that it falls in the GaSbGe family of materials.

In yet another embodiment, to form the materials within the GaSbGe family doped with Si or SiOx, an additional Si or SiOx sputter target (not shown) is optionally included in the chamber 320. Similarly, to form the GaSbGe family doped with SiNx, an additional SiNx sputter target is included in the chamber 320.

A collimator (not shown) can be used when sputtering a substrate that includes high aspect ratio features, to improve the uniformity of coverage over the high aspect ratio features, and for other reasons. Some sputtering systems have the ability to move a collimator into and out of the sputtering chamber as needed.

It will be appreciated that this is a simplified diagram sufficient for heuristic purposes of description herein. Sputter chambers are standard equipment in semiconductor manufacturing factories, and available from a variety of commercial sources.

Figure 15:
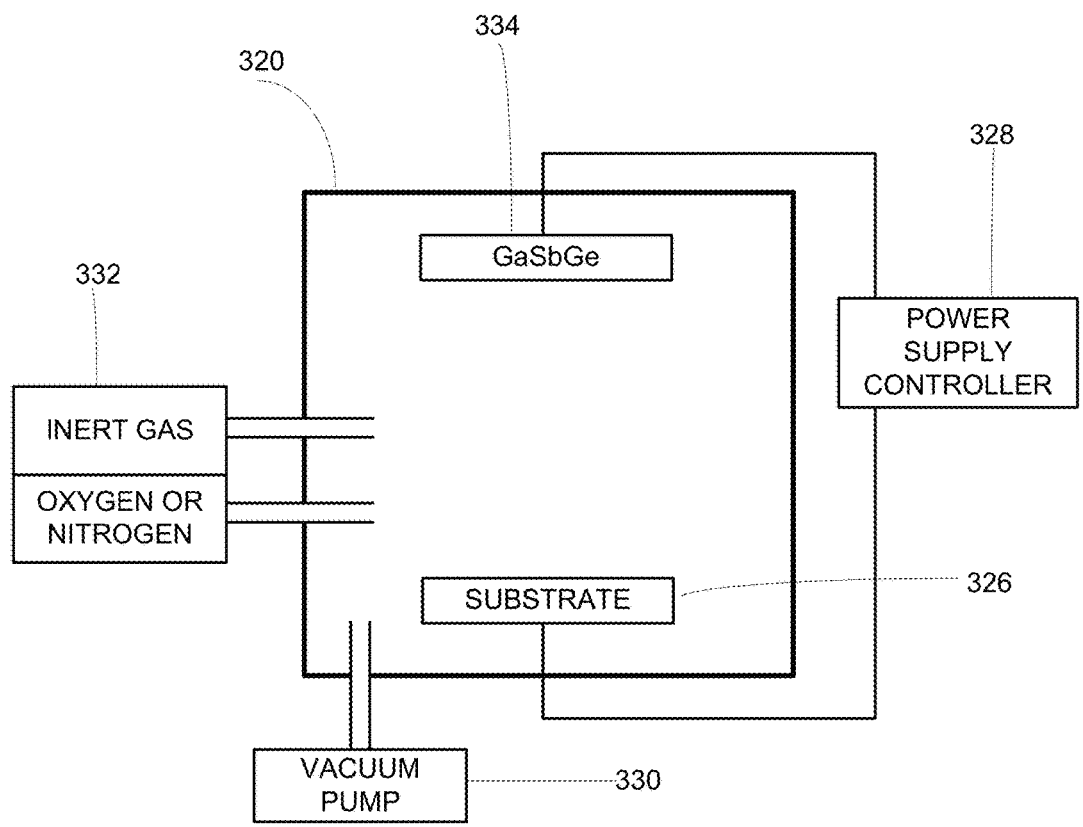
FIG. 15 is a simplified diagram of an alternative sputtering system used in a method of creating a GaSbGe memory device.

FIG. 15 is a simplified diagram of a method of creating a memory device out of a material within the GaSbGe family through an alternative sputtering system. FIG. 15 differs from the sputtering system of FIG. 14 in that the sputtering target 334 is comprised of a material in the GaSbGe family, and a separate Ge sputtering target is not utilized. Therefore the entire GaSbGe material that is deposited onto the substrate comes from a GaSbGe target and not a GaSb target in combination with a Ge target.

Alternatively, a GaSbGe—Si sputter target can be employed with reactive oxygen to form the material doped with SiOx within the GaSbGe family. Likewise, the sputter target can form the materials doped with SiNx within the GaSbGe family by introducing reactive nitrogen in the chamber.

In yet another embodiment, a GaSbGe—Si sputter target can be employed to form the material doped with Si within the GaSbGe family.

In yet other embodiments, a GaSbGe—Si sputter target can be employed with a reactive atmosphere containing oxygen or nitrogen to form the material doped with silicon oxide or silicon nitride within the GaSbGe family.

Figure 16:
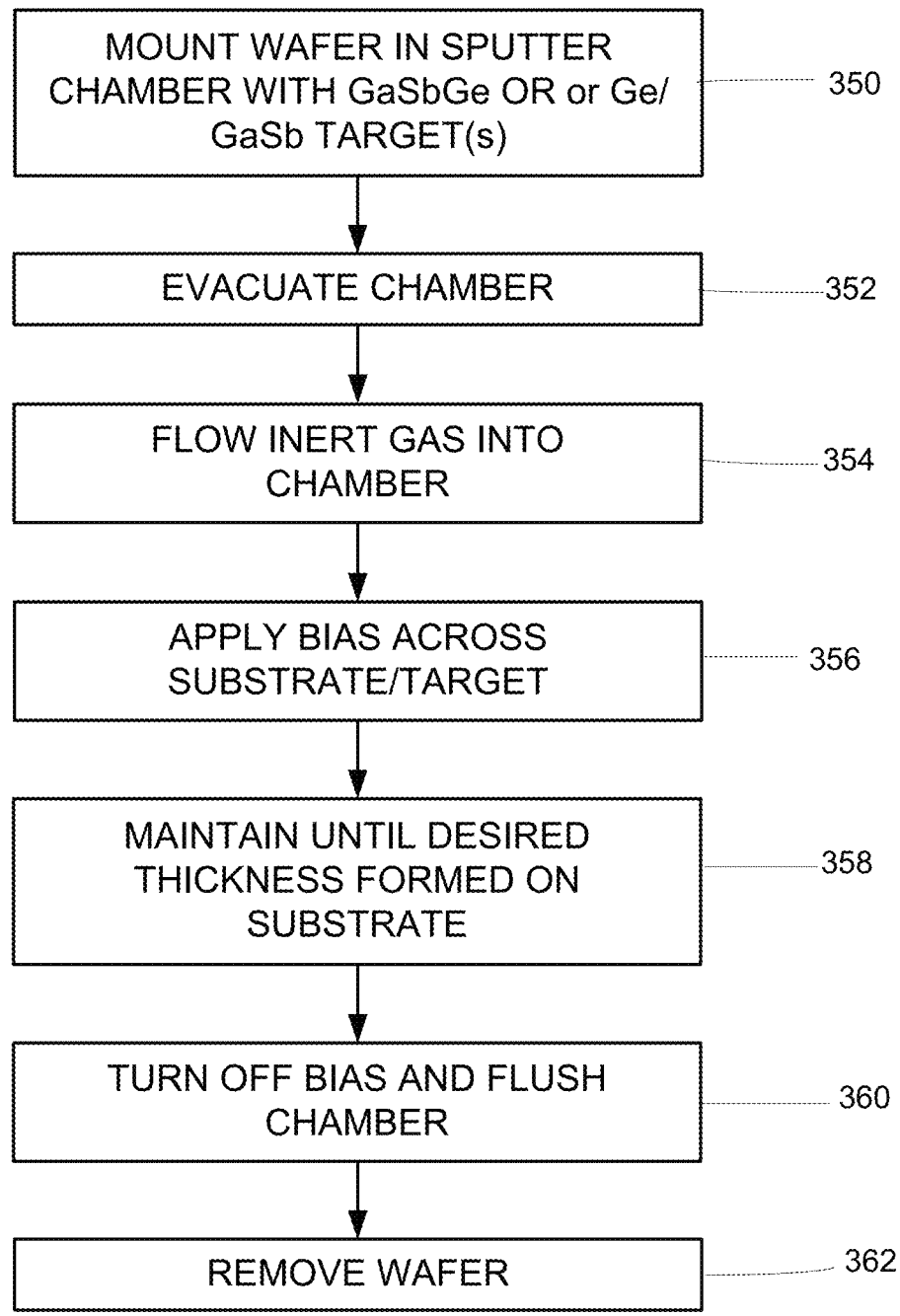
FIG. 16 is a process flow for forming a layer of GaSbGe phase change material using a sputtering system.

FIG. 16 illustrates a process flow for forming a layer of GaSbGe phase change material using either of the previously described methods. The process includes first mounting the wafer in a sputter chamber having the germanium and GaSb phase change material targets, or a GaSbGe family of material composition target (350). Next, the chamber is evacuated (352) to allow for the creation of a flow of ions sputtered from the target source or sources. An inert gas such as argon is flowed into the chamber, to establish an atmosphere suitable for sputtering (354). Suitable bias voltages are applied across the substrate and targets, such as a DC bias, to establish an electric field within the sputter chamber necessary to induce the sputtering process (356). Optionally, a pre-sputtering interval can be executed to prepare the target before exposing the wafer to the sputtering atmosphere. The conditions for sputtering are maintained with the wafer exposed, for an interval of time sufficient to obtain the desired thickness of memory material on the substrate (358). The bias is turned off, and the chamber is flushed (360). Finally, the wafer or substrate with deposited GaSbGe layer is removed (362).

Figure 17:
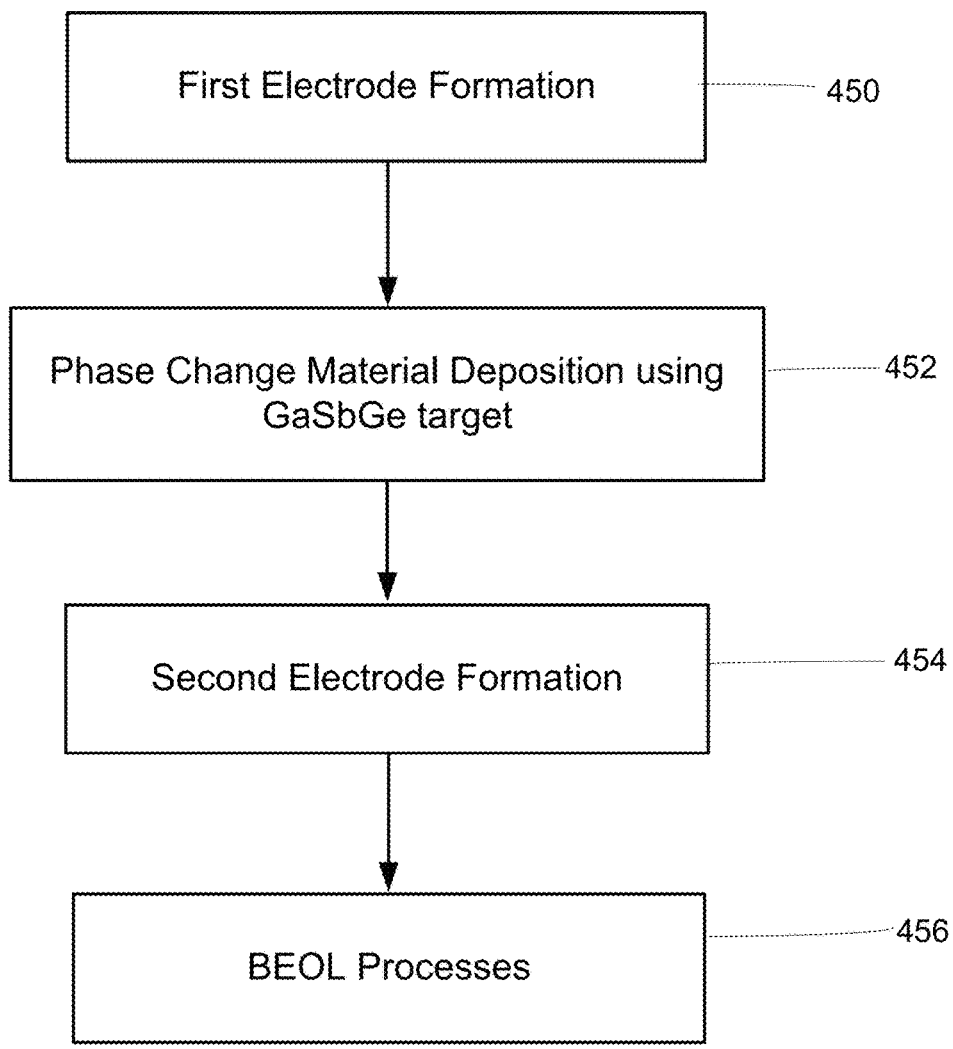
FIG. 17 is a manufacturing process flow for fabricating a memory cell from a GaSbGe material.

FIG. 17 illustrates a manufacturing process flow for manufacturing a memory cell including a memory element with a structure of the memory cell shown in FIG. 11, wherein the bulk stoichiometry of the memory element is of a material from the GaSbGe family. Reference numerals used in the following description of the process of FIG. 17 are taken from FIG. 11. At step 450 the first electrode 306 having a width 312 (or diameter) is formed extending through dielectric layer 308. The first electrode 306 comprises TiN and the dielectric layer 308 comprises SiN. Alternatively the first electrode 306 can have a sublithographic width 312 (or diameter).

The first electrode 306 is connected to a connector extending through dielectric layer 308 to underlying access circuitry (not shown). The underlying access circuitry can be formed by standard processes as known in the art, and the configuration of elements of the access circuitry depends upon the array configuration in which the memory cells described herein are implemented. Generally, the access circuitry may include access devices such as transistors and diodes, word lines and sources lines, conductive plugs, and doped regions within a semiconductor substrate.

The first electrode 306 and the dielectric layer 308 can be formed, for example, using methods, materials, and processes as disclosed in U.S. patent application Ser. No. 11/764,678 filed on 18 Jun. 2007 entitled "Method for Manufacturing a Phase Change Memory Device with Pillar Bottom Electrode" (now U.S. Pat. No. 8,138,028), which is incorporated by reference herein. For example, a layer of electrode material can be formed on the top surface of access circuitry (not shown), followed by patterning of a layer of photoresist on the electrode layer using standard photolithographic techniques so as to form a mask of photoresist overlying the location of the first electrode 306. Next, the mask of photoresist is trimmed, using for example oxygen plasma, to form a mask structure having sublithographic dimensions overlying the location of the first electrode 306. Then the layer of electrode material is etched using the trimmed mask of photoresist, thereby forming the first electrode 306 having a sublithographic width 312. Next dielectric material is formed and planarized to form dielectric layer 308.

At step 452 a phase change element is formed having a bulk stoichiometry of a phase change material from the GaSbGe family.

Figure 19:
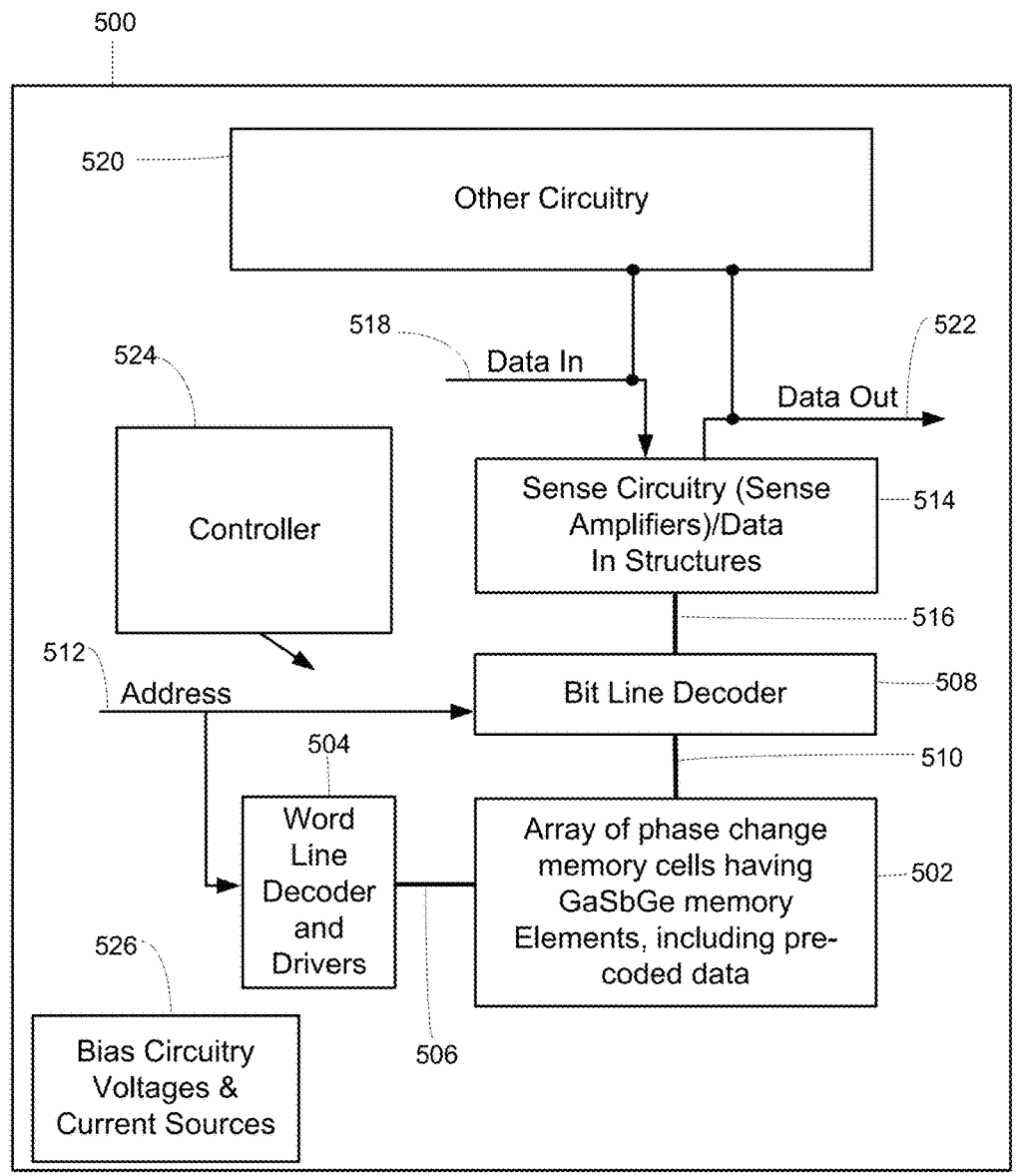
FIG. 19 is a simplified block diagram of an integrated circuit implementing an array of memory cells fabricated from a GaSbGe material.

Next, at step 454 a second electrode 310 is formed and at step 456 back-end-of-line (BEOL) processing is performed to complete the semiconductor process steps of the chip, resulting in the structure illustrated in FIG. 19. The BEOL processes can be standard processes as known in the art, and the processes performed depend upon the configuration of the chip in which the memory cell is implemented. Generally, the structures formed by BEOL processes may include contacts, inter-layer dielectrics and various metal layers for interconnections on the chip including circuitry to couple the memory cell to periphery circuitry. These BEOL processes may include deposition of dielectric material at elevated temperatures, such as depositing SiN at 400° C. or high density plasma HDP oxide deposition at temperatures of 500° C. or greater. As a result of these processes, control circuits and biasing circuits as shown in FIG. 14 are formed on the device.

Figure 18:
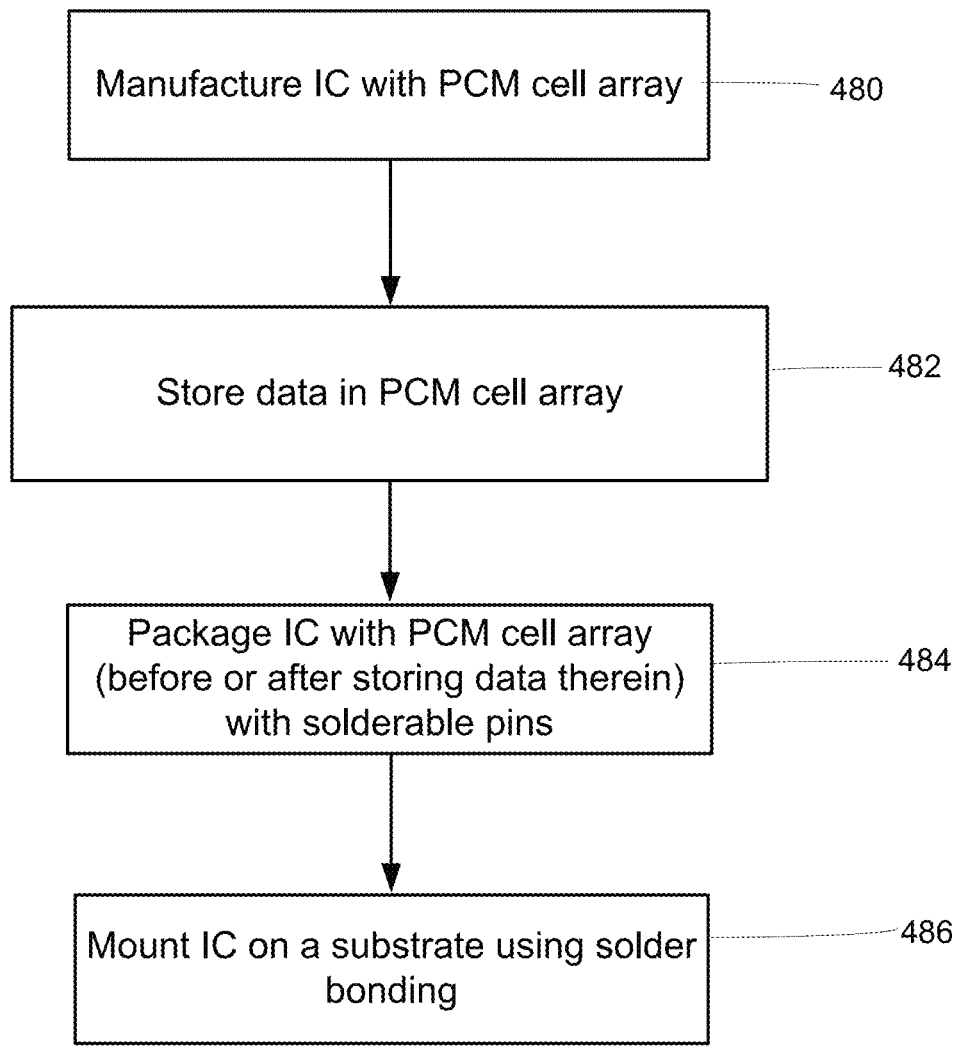
FIG. 18 is a manufacturing process flow for fabricating an integrated circuit, with data stored in a memory cell array including a GaSbGe material, before solder bonding.

FIG. 18 is a simplified flowchart illustrating a manufacturing process. The simplified process flow begins with manufacturing an integrated circuit with a phase change memory cell array using processes such as described in FIGS. 16 and 17 (480). Data can be stored in all or part of the phase change memory cell array on the integrated circuit using a programming machine, adapted for connection to the integrated circuit for storage of data thereon before or after packaging, and before mounting (482). The integrated circuit is packaged in a form that can include solderable pens or other connectors adapted for connection to a substrate like a printed circuit board or other mounting surface used for deploying integrated circuits in a system (484). The packaged integrated circuit is later mounted on a substrate using solder bonding in some embodiments, which exposes the packaged integrated circuits to elevated temperatures (e.g. about 270° C. for about 30 seconds) as discussed above (486). However, because of utilization of memory materials as described herein, the data stored before the solder bonding process is retained.

FIG. 19 is a simplified block diagram of an integrated circuit 500 including a memory array 502 having memory cells with memory elements comprised of materials within the GaSbGe family, such as material 7. In some embodiments, data may pre-coded, that is stored in the memory before solder bonding, or otherwise mounting the integrated circuit in a system. A word line decoder at 504 having read, set and reset modes is coupled to and in electrical communication with a plurality of word lines 506 arranged along rows in the memory array 502. A bit line (column) decoder 508 is in electrical communication with a plurality of bit lines 510 arranged along columns in the array 502 for reading, setting, and resetting the phase change memory cells (not shown) in array 502. Addresses are supplied on bus 512 to word line decoder and drivers 504 and bit line decoder 508. Sense circuitry (Sense amplifiers) and data-in structures in block 514, including voltage and/or current sources for the read, set, and reset modes are coupled to bit line decoder 508 via data bus 516. Data is supplied via a data-in line 518 from input/output ports on integrated circuit 500, or from other data sources internal or external to integrated circuit 500, to data-in structures in block 514. Other circuitry 520 may be included on integrated circuit 500, such as a general purpose processor or special purpose application circuitry, or a combination of modules providing system-on-a-chip functionality supported by array 502. Data is supplied via a data-out line 522 from the sense amplifiers in block 514 to input/output ports on integrated circuit 500, or to other data destinations internal or external to integrated circuit 500.

A controller 524 implemented in this example, using a bias arrangement state machine, controls the application of bias circuitry voltage and current sources 526 for the application of bias arrangements including read, program, erase, erase verify and program verify voltages and/or currents for the word lines and bit lines. In addition, bias arrangements for melting/cooling cycling may be implemented. Controller 524 may be implemented using special-purpose logic circuitry as known in the art. In alternative embodiments, controller 524 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 524.

New phase-change materials based on Ga—Sb—Ge and doped Ga—Sb—Ge system can provide fast switching speed and also excellent data retention New suggested phase-change materials with excellent data retention (220° C. —10 years), and which also pass the solder bonding thermal budget test (260° C. —30 s), are suitable for embedded automotive applications.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A phase change material, comprising $Ga_xSb_yGe_z$, wherein x, y and z are atomic percentages, with a Ga atomic concentration x within a range from 20% to 45%, a Sb atomic concentration y within a range from 25% to 40% and a Ge atomic concentration z within a range from 25% to 55%.

2. The phase change material of claim 1, wherein the material has a crystallization transition temperature $T_x$ greater than 360° C.

3. The phase change material of claim 1, further comprising one or more added elements selected from Si, C, O and N in an amount or amounts effective to provide a crystallization transition temperature $T_x$ greater than 400° C.

4. The phase change material of claim 1, further comprising a Si atomic concentration within a range from 3% to 12% and an O atomic concentration within a range from 6% to 25%.

5. The phase change material of claim 1, further comprising a Si atomic concentration within a range from 3% to 12% and a N atomic concentration within a range from 3% to 12%.

6. The phase change material of claim 1, further comprising silicon oxide in an amount effective to establish a crystallization transition temperature $T_x$ greater than 400° C.

7. The phase change material of claim 1, further comprising silicon nitride in an amount effective to establish a crystallization transition temperature $T_x$ greater than 400° C.

8. A phase change memory device comprising:
a first electrode and second electrode; and
a body of phase change memory material between the first and second electrodes, wherein the body of phase change memory material comprises a combination of Ga, Sb and Ge in amounts effective to provide a crystallization transition temperature greater than to 360° C.

9. The device of claim 8, wherein the phase change memory material has a composition on a $Ga_xSb_y$ tie line in a ternary phase diagram for Ga—Sb—Ge, where x and y in combination add to 100 and each falls in a range of 50 plus or minus 10%, and comprises an amount of silicon oxide effective to provide a crystallization transition temperature $T_x$ greater than 400° C.

10. The device of claim 8, wherein the phase change memory material has a composition on a $Ga_xSb_y$ tie line in a ternary phase diagram for Ga—Sb—Ge, where x and y in combination add to 100 and each falls in a range of 50 plus or minus 10%, and comprises an amount of silicon nitride effective to provide a crystallization transition temperature greater than 400° C.

11. The device of claim 8, wherein the body of phase change material further comprises one or more added elements selected from Si, C, O and N in an amount or amounts effective to provide a crystallization transition temperature $T_x$ greater than 400° C.

12. The device of claim 8, wherein the phase change material has a composition on a $Ga_xSb_y$ tie line in a ternary phase diagram for Ga—Sb—Ge, where x and y in combination add to 100 and each falls in a range of 50 plus or minus 10%, and include an amount of Ge effective to provide a crystallization transition temperature Tx that is greater than 360° C.

13. The device of claim 8, wherein the body of phase change material comprises $Ga_xSb_yGe_z$, wherein x, y and z are atomic percentages, with a Ga atomic concentration x is within a range from 20% to 45%, a Sb atomic concentration y is within a range from 25% to 40% and a Ge atomic concentration z is within a range from 25% to 55%.

14. The device of claim 13, further comprising a Si atomic concentration within a range from 3% to 12% and an O atomic concentration within a range from 6% to 25%.

15. The device of claim 13, further comprising a Si atomic concentration within a range from 3% to 12% and a N atomic concentration within a range from 3% to 12%.

16. A method for manufacturing a phase change memory device, the method comprising:
forming an integrated circuit including a memory array of programmable resistance memory cells comprising a phase change memory material; and
mounting the integrated circuit on a substrate, wherein the phase change memory material comprises $Ga_xSb_yGe_z$, wherein a Ga atomic concentration x is within a range from 20% to 45%, a Sb atomic concentration y is within a range from 25% to 40% and a Ge atomic concentration z is within a range from 25% to 55%.

17. The method of claim 16, wherein the phase change memory material further comprises one or more added elements selected from Si, C, O and N in an amount or amounts effective to provide a crystallization transition temperature greater than to 400° C.

18. The method of claim 16, further comprising mounting the integrated circuit on the substrate by solder bonding, and storing a data set in the memory array before mounting the integrated circuit by solder bonding.

19. The method of claim 16, wherein the amounts include a Si atomic concentration within a range from 3% to 12% and an O atomic concentration within a range from 6% to 25%.

20. The method of claim 16, wherein the amounts include a Si atomic concentration within a range from 3% to 12% and a N atomic concentration within a range from 3% to 12%.

* * * * *